US010872394B2

(12) United States Patent
Kim et al.

(10) Patent No.: US 10,872,394 B2
(45) Date of Patent: Dec. 22, 2020

(54) FREQUENT PATTERN MINING METHOD AND APPARATUS

(71) Applicant: Daegu Gyeongbuk Institute of Science and Technology, Daegu (KR)

(72) Inventors: Min Soo Kim, Daegu (KR); Kangwook Chon, Jeollabuk-do (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 300 days.

(21) Appl. No.: 15/955,879

(22) Filed: Apr. 18, 2018

(65) Prior Publication Data

US 2018/0315161 A1 Nov. 1, 2018

Related U.S. Application Data

(60) Provisional application No. 62/490,668, filed on Apr. 27, 2017.

(30) Foreign Application Priority Data

Aug. 7, 2017 (KR) .................. 10-2017-0099641

(51) Int. Cl.
G06F 16/00 (2019.01)
G06T 1/60 (2006.01)
G06T 1/20 (2006.01)
G01R 31/319 (2006.01)
G06F 16/23 (2019.01)
(Continued)

(52) U.S. Cl.
CPC .......... G06T 1/60 (2013.01); G01R 31/31921 (2013.01); G06F 16/20 (2019.01); G06F 16/2237 (2019.01); G06F 16/23 (2019.01); G06F 16/2465 (2019.01);
(Continued)

(58) Field of Classification Search
CPC .............. G06F 9/30036; G06F 9/3879; G06F 9/30058; G06F 9/383; G06F 9/3838; G06F 9/3848; G06F 12/1009; G06F 12/109; G06F 12/1036; G06F 12/0223; G06F 12/0284; G06F 12/0238; G06F 12/0253; G06F 12/0837; G06F 16/20; G06F 16/2465; G06F 16/2237; G06F 16/23; G06F 16/9024; G06F 2216/03; G01R 31/31921
See application file for complete search history.

(56) References Cited

U.S. PATENT DOCUMENTS 6,249,533 B1 * 6/2001 Goishi ............. G01R 31/31919
714/743
6,665,669 B2 * 12/2003 Han .................... G06F 16/2465
(Continued)

OTHER PUBLICATIONS

Hang Liu et al., "Enterprise: Breadth-First Graph Traversal on GPUs", ACM 978-1-4503-3723-6/15/11, Nov. 15-20, 2015.*
(Continued)

Primary Examiner — Srirama Channavajjala

(57) ABSTRACT

Disclosed is a frequent pattern mining method and apparatus, the frequent pattern mining apparatus that may copy relative memory addresses of candidate itemsets, from a main memory to device memories of graphic processing units (GPUs), copy at least one same block required for calculating supports of the candidate itemsets, from the main memory to the device memories, and update the supports of the candidate itemsets by synchronizing partial supports processed by the GPUs.

13 Claims, 12 Drawing Sheets

(51) Int. Cl.
  *G06F 16/20* (2019.01)
  *G06F 16/2458* (2019.01)
  *G06F 16/901* (2019.01)
  *G06F 16/22* (2019.01)

(52) U.S. Cl.
  CPC ............ *G06F 16/9024* (2019.01); *G06T 1/20* (2013.01); *G06F 2216/03* (2013.01)

(56) References Cited

U.S. PATENT DOCUMENTS

| | | | | |
|---|---|---|---|---|
| 6,799,181 | B2* | 9/2004 | Vishnubhotla | G06F 16/2465 |
| 7,379,937 | B2* | 5/2008 | Inokuchi | G06F 16/2465 |
| 7,474,312 | B1* | 1/2009 | Rohrer | G06F 3/14 |
| | | | | 345/530 |
| 7,483,031 | B2* | 1/2009 | Williams | G06F 3/1446 |
| | | | | 345/502 |
| 7,512,626 | B2* | 3/2009 | Chitgupakar | G06F 16/2465 |
| 7,808,504 | B2* | 10/2010 | Bakalash | G06F 9/5083 |
| | | | | 345/519 |
| 8,352,476 | B2* | 1/2013 | Li | G06F 16/2237 |
| | | | | 707/745 |
| 2006/0098022 | A1* | 5/2006 | Andrews | G06T 15/005 |
| | | | | 345/557 |
| 2007/0091100 | A1* | 4/2007 | Brothers | G06F 9/485 |
| | | | | 345/506 |
| 2007/0220034 | A1* | 9/2007 | Iyer | G06F 16/2465 |
| 2010/0017450 | A1* | 1/2010 | Sun | G06F 7/785 |
| | | | | 708/401 |
| 2010/0118041 | A1* | 5/2010 | Chen | G06F 12/1063 |
| | | | | 345/542 |
| 2010/0135418 | A1* | 6/2010 | Zhang | H04N 19/44 |
| | | | | 375/240.25 |
| 2010/0174670 | A1* | 7/2010 | Malik | G06F 16/35 |
| | | | | 706/12 |
| 2010/0318593 | A1* | 12/2010 | Humphrey | G06F 17/12 |
| | | | | 708/446 |
| 2012/0096031 | A1* | 4/2012 | Yoshida | G06F 16/2465 |
| | | | | 707/776 |
| 2013/0241938 | A1* | 9/2013 | Gruber | G06T 15/005 |
| | | | | 345/501 |
| 2014/0032848 | A1* | 1/2014 | Zhao | G06F 12/0826 |
| | | | | 711/130 |
| 2014/0049548 | A1* | 2/2014 | Rao | G06T 1/60 |
| | | | | 345/502 |
| 2017/0062074 | A1* | 3/2017 | Kim | G11C 29/26 |

OTHER PUBLICATIONS

Yusuke Kozawa et al., "GPU Acceleration of Probabilistic Frequent Itemset Miningfrom Uncertain Databases ", CIKM'12, Maui, HI, USA, Oct. 29-Nov. 2, 2012, pp. 892-901.*

George Teodoro et al., "Tree Projection-based Frequent Itemset Mining on multi-core CPUs and GPUs", 22nd International Symposium on Computer Architecture and High Performance Computing, IEEE 2010, pp. 47-54.*

Fan Zhang et al., "GPApriori: GPU-Accelerated Frequent Itemset Mining", IEEE International Conference on Cluster Computing, 2011, pp. 590-5944.*

Yongjin Yeom et al., High-Speed Implementations of Block Cipher ARIA Using Graphics Processing Units, 2008 International Conference on Multimedia and Ubiquitous Engineeringg, pp. 271-275.*

Xiong-FE1 Li et al., "A Fast Algorithm on Discovery Large Itemsets", Proceedings of the Second International Conference on Machine Learning and Cybernetics, Wan, Nov. 2-5, 2003, pp. 204-209.*

Sheng-Hui Liu et al., "IOMRA—A High Efficiency Frequent Itemset Mining Algorithm Based on the MapReduce Computation Modell", 17th International Conference on Computational Science and Engineering,2014 IEEE, pp. 1290-1295.*

Zhang et al. "Accelerating Frequent Itemset Mining on Graphics Processing Units", The Journal of Supercomputing, 66(1): 94-117, Published Online Feb. 2, 2013.

* cited by examiner

FIG. 2

Transaction data (horizontal format) — 201

| TID | Transactions |
|---|---|
| 1 | A, B, C, D, E |
| 2 | B, C, D, E, F |
| 3 | C, E, F |
| 4 | A, C, E, F |
| 5 | A, E, G |
| 6 | A, B, C, D, G |
| 7 | - |
| 8 | - |
| 9 | A, B, C, D, E |
| 10 | F, G |
| 11 | A, C, E, F, G |
| 12 | F |

Transaction bitmap (vertical format) — 202

| Item | bit vector |
|---|---|
| A | 100111001010 |
| B | 110001001000 |
| C | 111101001010 |
| D | 110001001000 |
| E | 111110001010 |
| F | 011100000111 |
| G | 000011000110 |

Transaction blocks (vertical format)

| Item | $TB_1$ | $TB_2$ | $TB_3$ |
|---|---|---|---|
| A | 1001 | 1100 | 1010 |
| B | 1100 | 0100 | 1000 |
| C | 1111 | 0100 | 1010 |
| D | 1100 | 0100 | 1000 |
| E | 1111 | 1000 | 1010 |
| F | 0111 | 0000 | 0111 |
| G | 0000 | 1100 | 0110 |

203 — 204 — 205

FIG. 5
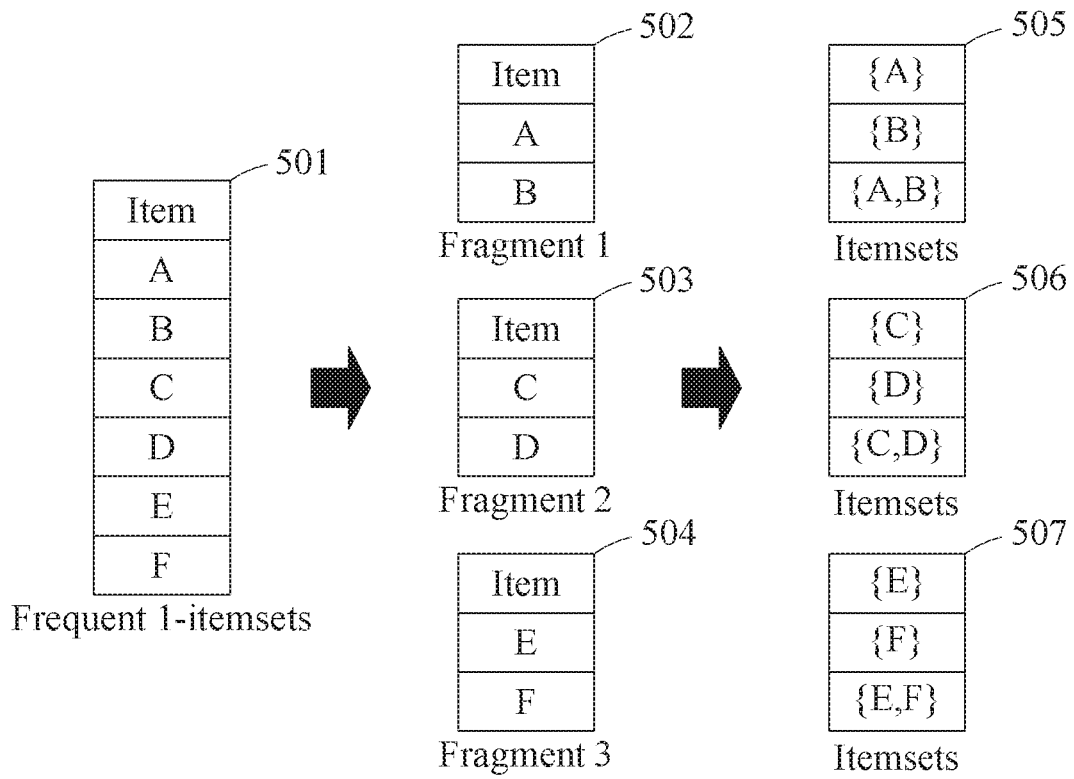
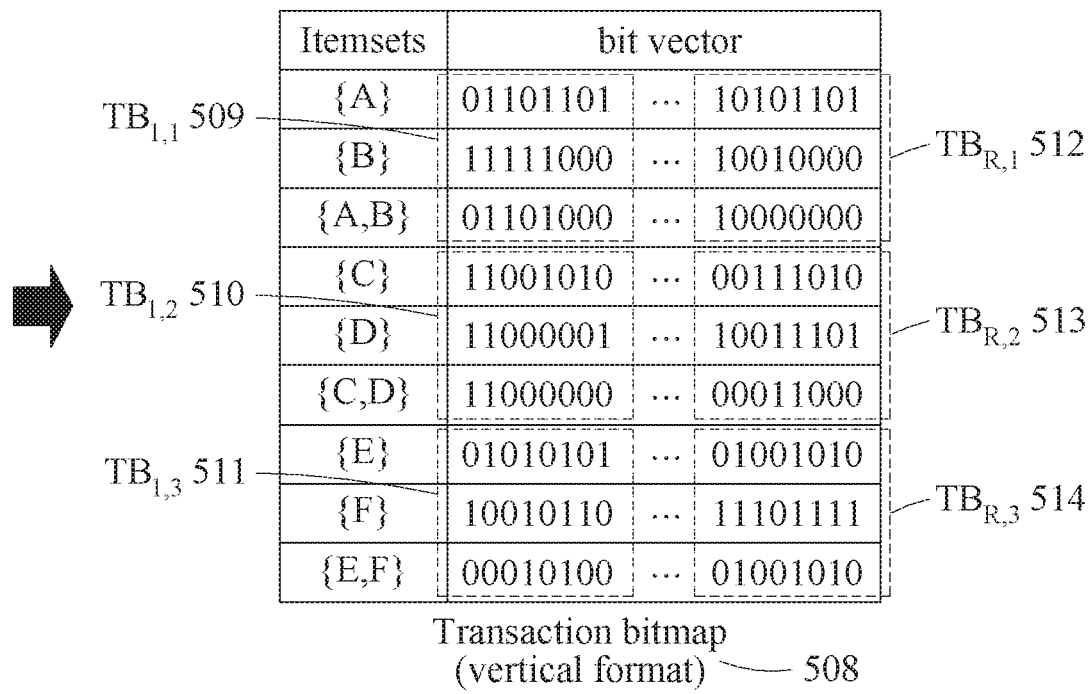

FREQUENT PATTERN MINING METHOD AND APPARATUS

RELATED APPLICATIONS

This application claims the benefit of priority under 35 USC § 119(e) of U.S. Provisional Patent Application No. 62/490,668 filed on Apr. 27, 2017, and Korean Patent Application No. 10-2017-0099641 filed on Aug. 7, 2017, the contents of which are incorporated herein by reference in their entirety.

FIELD AND BACKGROUND OF THE INVENTION

One or more example embodiments relate to a method and apparatus for mining a frequent pattern.

Frequent Itemset Mining (FIM) is a fundamental data mining technique. FIM is widely used in a wide range of disciplines such as market basket analysis, web usage mining, social network analysis, intrusion detection, bioinformatics, and recommendation systems. However, as the size of data increases, the relatively slow performance of the existing methods hinders its applicability. Deluge of data generated by automated systems for diagnostic or analysis purposes makes it difficult or even impossible to apply the FIM technique to many real application programs.

There have been proposed a lot of sequential FIM methods. However, those methods have a clear limit to the performance that may be achieved by a single thread. The existing methods often fail to find frequent itemsets in such big data within a reasonable amount of time. Thus, in terms of computational time, the FIM methods still have a challenging problem that has not yet been completely solved.

There are a lot of sequential FIM methods using a single central processing unit (CPU) thread. However, the sequential FIM methods all have a fundamental limit on the performance of mining since the clock speed of a CPU does not increase anymore in general.

In order to overcome the above limits, there have been proposed a number of parallel methods using multiple cores of CPU, multiple machines, or many cores of graphic processing units (GPUs). However, those parallel methods still have drawbacks such as relatively slow performance, limited size of data to deal with, and less scalability due to workload skewness.

In order to overcome the performance limit, there have been proposed a number of parallel FIM methods. Those parallel FIM methods are classified into three groups: (1) (CPU-based) multi-thread methods, (2) distributed methods, and (3) GPU-based methods. The term "multi-thread" may be omitted in the GPU-based methods since the GPU-based methods are obviously multi-threaded.

The multi-thread methods of the first group focus on accelerating the performance of single-thread methods by exploiting multi-core CPUs. The multi-thread methods may actually improve the performance much compared with the sequential FIM methods. However, the multi-thread methods may not be the best methods for the performance since the theoretical performance of a CPU is much lower than that of a GPU nowadays, and the performance gap between the CPU and the GPU is widening more and more as time goes on.

The distributed methods of the second group try to accelerate the performance by exploiting multiple machines. The distributed methods commonly have a serious drawback of large overhead of network communication.

The GPU-based methods of the third group focus on accelerating the performance by exploiting many cores of GPUs. The continuous advancement of the GPU technology makes the theoretical computing power of modern computers increasing. Due to the much higher theoretical computing performance of GPUs than CPUs, it becomes more and more important to exploit GPUs in a wide range of problems including frequent pattern mining. However, the existing GPU-based methods suffer from the limited size of data to deal with due to a limited GPU memory. In general, the size of the GPU memory tends to be much smaller than that of a main memory. Most of the GPU-based methods may find frequent patterns only on the data fitted in the GPU memory. Among the GPU-based methods, frontier expansion is the state-of-the-art method in this group that may handle larger datasets than the GPU memory. However, frontier expansion still may not deal with data as large as the CPU-based methods may do, since frontier expansion may not keep a large amount of data at an intermediate level of a pattern space in the GPU memory.

The existing FIM methods require computationally intensive processing in proportion to the size of dataset. The existing FIM methods fail in a mining operation due to a large amount of intermediate data. Although an input dataset fits in a memory, the intermediate data may not fit in the memory since the size of the intermediate data increases. This tendency may be more marked when exploiting GPUs for FIM due to the relatively small capacity of the GPU memory.

Most of the existing parallel methods also suffer from the problem of workload skewness. The workload skewness is very common and significantly affects the performance in parallel computing. The existing parallel methods usually divide a search space of patterns to be explored into multiple pieces, for example, equivalent classes, and assign each piece to each processor or machine. Each sub-tree of an enumeration tree tends to have a different amount of workload (size). As a result, the existing parallel methods are not very scalable in terms of the number of CPUs, machines or GPUs. That is, speed-up ratios of the existing parallel methods do not increase proportionally as the number of processors increases.

A data mining technique to overcome an inefficiency of keeping a large amount of data of an intermediate level in the GPU memory and wasting GPU clocks, a restraint of having a large amount of data transfer overhead between the main memory and the GPU memory, and a restraint of not being scalable in terms of the number of GPUs is needed.

SUMMARY OF THE INVENTION

An aspect provides a frequent pattern mining method that may solve a problem of increasing an amount of computation of graphic processing units (GPUs) as the size of dataset increases.

Another aspect also provides a frequent pattern mining method that may reduce a possibility of pattern mining failure caused by the overly large amount of intermediate data compared with a GPU memory.

Still another aspect also provides a frequent pattern mining method that may solve an inefficiency issue in terms of the performance and memory usage under the GPU architecture caused by keeping and utilizing patterns at intermediate levels of an enumeration tree.

Further another aspect also provides a frequent pattern mining method that may solve a workload skewness issue between GPUs.

According to an aspect, there is provided a frequent pattern mining method including generating blocks from bit vectors corresponding to frequent 1-itemsets, copying relative memory addresses of candidate k-itemsets, from a main memory of a central processing unit (CPU) to device memories of graphic processing units (GPUs), copying at least one same block required for calculating supports of the candidate k-itemsets among the blocks, from the main memory to the device memories, and updating the supports of the candidate k-itemsets by synchronizing partial supports calculated by the GPUs.

The copying of the relative memory addresses may include copying a relative memory address of a first candidate k-itemset to a device memory of a first GPU, and copying a relative memory address of a second candidate k-itemset to a device memory of a second GPU, and the copying of the at least one same block may include copying a first block of the blocks to the device memory of the first GPU, and copying the first block to the device memory of the second GPU.

The frequent pattern mining method may further include generating transaction blocks by vertically partitioning a transaction bitmap including the bit vectors, the transaction bitmap being represented by a vertical bitmap layout, and the blocks may be the transaction blocks.

The copying of the relative memory addresses may include generating the relative memory addresses of the candidate k-itemsets using a dictionary that maps a frequent 1-itemset of the transaction bitmap to a relative memory address, and copying the generated relative memory addresses to the device memories as outer operand.

The generating of the relative memory addresses may include identifying frequent 1-itemsets included in a candidate k-itemset, and generating a relative memory address of the candidate k-itemset by combining relative memory addresses of the identified frequent 1-itemsets.

The copying of the at least one same block may include copying one of the transaction blocks to the device memories as inner operand, and the updating may include calculating, by the GPUs, partial supports corresponding to the relative memory addresses using the copied transaction block and the relative memory addresses, and updating the supports of the candidate k-itemsets by synchronizing the partial supports corresponding to the relative memory addresses.

The frequent pattern mining method may further include generating fragments by dividing the frequent 1-itemsets, generating itemsets being all combinations of frequent 1-itemsets in each of the fragments, calculating bit vectors corresponding to the generated itemsets, and generating fragment blocks by vertically partitioning a transaction bitmap including the calculated bit vectors and dividing the transaction bitmap for each of the fragments, the transaction bitmap being represented by a vertical bitmap layout, and the blocks may be the fragment blocks.

The copying of the relative memory addresses may include generating the relative memory addresses of the candidate k-itemsets using a dictionary that maps an itemset of the transaction bitmap to a relative memory address, and copying the generated relative memory addresses to the device memories as outer operand.

The generating of the relative memory addresses may include identifying itemsets included in a candidate k-itemset, and generating a relative memory address of the candidate k-itemset by combining relative memory addresses of the identified itemsets.

The copying of the at least one same block may include copying at least one of the fragment blocks to the device memories as inner operand, and the updating may include calculating, by the GPUs, partial supports corresponding to the relative memory addresses using the copied fragment block and the relative memory addresses, and updating the supports of the candidate k-itemsets by synchronizing the partial supports corresponding to the relative memory addresses.

According to another aspect, there is provided a frequent pattern mining method including mining frequent 1-itemsets from transaction data, generating transaction blocks by vertically partitioning a transaction bitmap including bit vectors corresponding to the frequent 1-itemsets, the transaction bitmap being represented by a vertical bitmap layout, calculating supports of candidate k-itemsets from the transaction blocks using GPUs, and mining frequent k-itemsets based on the supports.

The calculating may include generating relative memory addresses of the candidate k-itemsets using a dictionary that maps a frequent 1-itemset of the transaction bitmap to a relative memory address, copying the relative memory addresses to device memories of the GPUs as outer operand, copying one of the transaction blocks to the device memories as inner operand, calculating, by the GPUs, partial supports corresponding to the relative memory addresses using the copied transaction block and the relative memory addresses, and updating the supports of the candidate k-itemsets by synchronizing the partial supports.

The calculating of the supports may further include copying a second transaction block to the device memories as inner operand, calculating, by the GPUs, second partial supports corresponding to the relative memory addresses using the copied second transaction block and the relative memory addresses, and updating the supports of the candidate k-itemsets by synchronizing the second partial supports.

According to still another aspect, there is provided a frequent pattern mining method including mining frequent 1-itemsets from transaction data, generating fragments by dividing the frequent 1-itemsets, generating itemsets being all combinations of frequent 1-itemsets in each of the fragments, calculating bit vectors corresponding to the generated itemsets, generating fragment blocks by vertically partitioning a transaction bitmap including the calculated bit vectors and dividing the transaction bitmap for each of the fragments, the transaction bitmap being represented by a vertical bitmap layout, calculating supports of candidate k-itemsets from the fragment blocks using GPUs, and mining frequent k-itemsets based on the supports.

The calculating may include generating relative memory addresses of the candidate k-itemsets using a dictionary that maps an itemset of the transaction bitmap to a relative memory address, copying the relative memory addresses to device memories of the GPUs as outer operand, copying at least one of the fragment blocks to the device memories as inner operand, calculating, by the GPUs, partial supports corresponding to the relative memory addresses using the copied fragment block and the relative memory addresses, and updating the supports of the candidate k-itemsets by synchronizing the partial supports.

The calculating of the supports may further include copying at least one second fragment block to the device memories as inner operand, calculating, by the GPUs, second partial supports corresponding to the relative memory addresses using the copied second fragment block and the relative memory addresses, and updating the supports of the candidate k-itemsets by synchronizing the second partial supports.

According to further another aspect, there is provided a frequent pattern mining method including mining frequent 1-itemsets from transaction data, selecting a traversal from the first level (TFL) strategy or a hopping from intermediate level (HIL) strategy, generating blocks from bit vectors corresponding to the frequent 1-itemsets based on the selected strategy, calculating supports of candidate k-itemsets from the blocks using GPUs, and mining frequent k-itemsets based on the supports.

According to yet another aspect, there is provided a frequent pattern mining apparatus including a CPU, and a main memory. The CPU may be configured to generate blocks from bit vectors corresponding to frequent 1-itemsets, copy relative memory addresses of candidate k-itemsets, from the main memory to device memories of GPUs, copy at least one same block required for calculating supports of the candidate k-itemsets among the blocks, from the main memory to the device memories, and update the supports of the candidate k-itemsets by synchronizing partial supports calculated by the GPUs.

Additional aspects of example embodiments will be set forth in part in the description which follows and, in part, will be apparent from the description, or may be learned by practice of the disclosure.

BRIEF DESCRIPTION OF THE SEVERAL VIEWS OF THE DRAWINGS

These and/or other aspects, features, and advantages of the invention will become apparent and more readily appreciated from the following description of example embodiments, taken in conjunction with the accompanying drawings of which:

FIG. 2 illustrates transaction blocks according to an example embodiment;

FIG. 5 illustrates fragment blocks according to an example embodiment;

DESCRIPTION OF SPECIFIC EMBODIMENTS OF THE INVENTION

Figure 1:
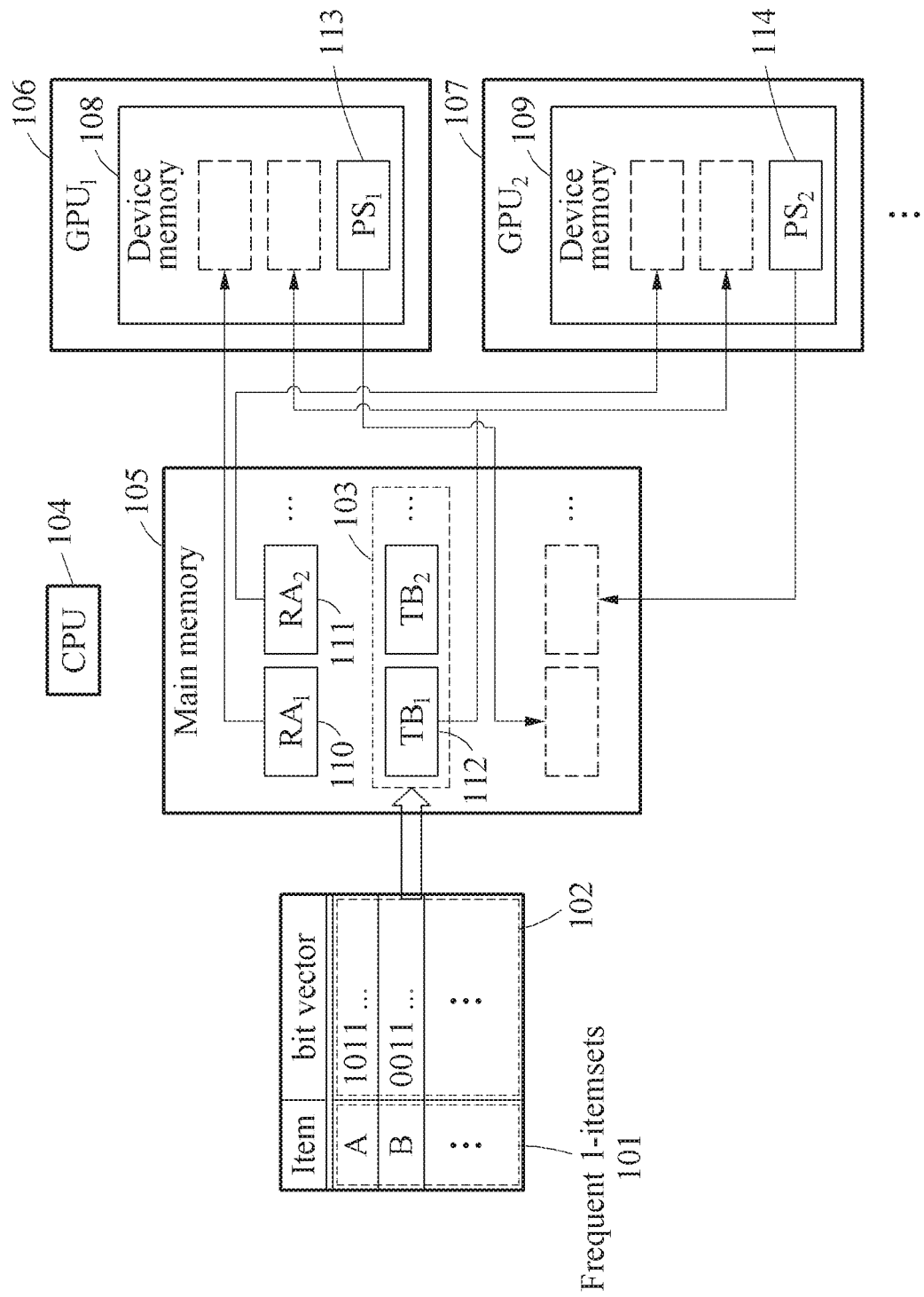
FIG. 1 illustrates a frequent pattern mining method according to an example embodiment.

The following structural or functional descriptions are exemplary to merely describe the exemplary embodiments, and the scope of the exemplary embodiments is not limited to the descriptions provided in the present specification. Various changes and modifications can be made thereto by those of ordinary skill in the art.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

Hereinafter, the example embodiments will be described in detail with reference to the accompanying drawings, wherein like drawing reference numerals are used for like elements.

"Overview"

A frequent pattern mining apparatus according to an example embodiment may mine frequent patterns from large-scale data using graphic processing units (GPUs). The frequent pattern mining apparatus is an apparatus that mines frequent patterns from data, and for example, may mine frequent itemsets from transaction data, and may be implemented using software modules, hardware modules, and a combination thereof.

Frequent itemset mining (FIM) is a technique of finding frequent itemsets from given data. FIM may determine all itemsets F that occur as a subset of at least a pre-defined fraction minsup of transactions in a given transaction database D={$t_1; t_2; \ldots ; t_0$}, where each transaction $t_i$ is a subset of items from I[1, N]. However, hereinafter, a concept of support is used instead of a fraction, and a support of an itemset refers to the number of occurrences of the itemset.

In transaction data D recorded in a database as shown in Table 1, Tid denotes an identifier corresponding to transactions, and the transactions denote a set of items corresponding to Tid. For example, transactions corresponding to Tid 1 are {Beer, Nuts, Diaper}.

TABLE 1

| Tid | Items |
|---|---|
| 1 | Beer, Nuts, Diaper |
| 2 | Beer, Coffee, Diaper |
| 3 | Beer, Diaper, Eggs |

TABLE 1-continued

| Tid | Items |
|---|---|
| 4 | Nuts, Eggs, Milk |
| 5 | Coffee, Diaper, Milk |

If the transaction data D as shown in Table 1 and a minimum support minsup are given, FIM may find, in D, all itemsets having supports greater than or equal to minsup. A support refers to a frequency of occurrence of an itemset in D, and a frequent itemset refers to an itemset having a support greater than or equal to minsup in D. For example, in a case in which minsup is "3" in the transaction data D of Table 1, FIM may find itemsets {Beer}, {Diaper} and {Beer, Diaper} from the input D. Here, the found itemsets {Beer}, {Diaper} and {Beer, Diaper} may be output as frequent itemsets. A frequent itemset including n items is referred to as a frequent n-itemset. In the transaction data D of Table 1, {Beer} and {Diaper} are frequent 1-itemsets, and {Beer, Diaper} is a frequent 2-itemset.

A GPU-based frequent itemset mining technique according to an example embodiment will be referred to as GMiner, and a method of performing GMiner will be referred to as a frequent pattern mining method. The frequent pattern mining apparatus may mine frequent patterns by performing the GMiner-based frequent pattern mining method.

GMiner may improve the performance of mining frequent patterns by fully exploiting the computational power of GPUs. GMiner may deal with large-scale data like central processing unit (CPU)-based methods, and solve the above problem of the existing GPU-based methods. GMiner proposes the following concepts: GMiner may mine frequent patterns from a first level of an enumeration tree, rather than keeping and utilizing the patterns at intermediate levels of the enumeration tree. GMiner may not materialize intermediate data, and thus provide an FIM technique which is quite effective and robust in terms of performance and memory usage of the GPU-based methods. In an example, GMiner proposes a traversal from the first level (TFL) strategy.

According to the TFL strategy, the frequent pattern mining apparatus may not keep a projected database and frequent itemsets of intermediate levels (of the enumeration tree) in a device memory of a GPU, but instead, may find all the frequent itemsets only using frequent 1-itemsets of a first level, denoted by $F_1$. According to the TFL strategy, the frequent pattern mining apparatus may reduce an amount of the device memory of the GPU used, and at the same time, paradoxically improve the performance of mining frequent patterns.

The TFL strategy may make sense under the GPU architecture where a gap between a processor speed and a memory speed is quite large. Under the GPU architecture, mining frequent n-itemsets by performing a large amount of computation based on a relatively small set $F_1$ may be faster than mining the same frequent n-itemsets by performing a small amount of computation based on a relatively large set, that is, (n−1)-itemsets. According to the TFL strategy, the frequent pattern mining apparatus may improve the performance of the state-of-the-art parallel methods including multi-thread methods, distributed methods, and GPU-based methods.

In addition to the TFL strategy, GMiner also proposes a hopping from intermediate level (HIL) strategy, in order to improve the performance of mining frequent patterns for datasets containing long patterns. According to the HIL strategy, the frequent pattern mining apparatus may reduce an amount of computation by utilizing a more device memory of a GPU, and thus may improve the performance of mining long patterns.

In addition to fast mining with efficient memory usage, the frequent pattern mining apparatus may solve the workload skewness that the existing parallel methods have. As a result, the performance of GMiner may increase linearly as the number of GPUs increases. GMiner proposes the concepts of a transaction block and a relative memory address to solve the workload skewness.

The transaction block is a fixed-size chunk of bitwise representation for transactions, and the relative memory address is array representation for candidate itemsets. For parallel processing, the frequent pattern mining apparatus may not divide a search space of the enumeration tree into sub-trees, but divide an array of relative memory addresses into multiple sub-arrays of the same size. Then, the frequent pattern mining apparatus may store each sub-array in each GPU and perform mining operations by streaming transaction blocks to all GPUs, where each GPU may have almost the same amount of workload.

Hereinafter, an overview of the frequent pattern mining method will be described with reference to FIG. 1, an example related to the TFL strategy will be described with reference to FIGS. 2 through 4, an example related to the HIL strategy will be described with reference to FIGS. 5 and 6, and an operation of exploiting multiple GPUs will be described with reference to FIG. 7. Elements of the frequent pattern mining apparatus will be described with reference to FIG. 8, and operations of the frequent pattern mining method will be described with reference to FIGS. 9 through 12.

FIG. 1 illustrates a frequent pattern mining method according to an example embodiment.

Referring to FIG. 1, a frequent pattern mining apparatus may load transaction data, and mine frequent 1-itemsets 101 from the loaded transaction data. Here, the transaction data is target data for frequent patterns, and may include at least one transaction corresponding to at least one item. As described above, the frequent pattern mining apparatus may mine frequent patterns using GMiner, and the following operations may be performed by GMiner.

The frequent pattern mining apparatus may generate blocks 103 from bit vectors 102 corresponding to the frequent 1-itemsets 101. The frequent pattern mining apparatus may process operations related to frequent pattern mining (FIM) using a CPU 104. In an example, the frequent pattern mining apparatus may include the CPU 104, a main memory 105, and GPUs 106 and 107. The GPUs 106 and 107 may include device memories 108 and 109, respectively. However, the frequent pattern mining apparatus may be implemented by at least one of the GPUs 106 and 107 and the CPU 104.

The frequent pattern mining apparatus may control the main memory 105 and the GPUs 106 and 107 using the CPU 104. For example, the frequent pattern mining apparatus may control data reading/writing operations related to the main memory 105 and data reading/writing operations related to the device memories 108 and 109 of the GPUs 106 and 107, and control processes or instructions related to AND operations of the GPUs 106 and 107. The frequent pattern mining apparatus may record the generated blocks 103 in the main memory 105. Generation of the blocks 103 will be described further below.

The frequent pattern mining apparatus may copy different relative memory addresses 110 and 111 of candidate k-itemsets from the main memory 105 of the CPU 104 to the device memories 108 and 109 of the GPUs 106 and 107. For example, the frequent pattern mining apparatus may copy the relative memory address $RA_1$ 110 to the device memory 108, and copy the relative memory address $RA_2$ 111 to the device memory 109. A relative memory address is an address to be used to identify one of the candidate k-itemsets, and may be expressed based on items in a candidate k-itemset. Generation and copying of the relative memory addresses 110 and 111 will be described further below.

The frequent pattern mining apparatus may copy at least one same block required for calculating supports of the candidate k-itemsets among the blocks 103, from the main memory 105 to the device memories 108 and 109. For example, the frequent pattern mining apparatus may copy the same block $TB_1$ 112 among the blocks 103 including $TB_1$ and $TB_2$, from the main memory 105 to the device memories 108 and 109. Copying of the blocks 103 will be described further below.

The frequent pattern mining apparatus may update the supports of the candidate k-itemsets by synchronizing partial supports 113 and 114 calculated by the GPUs 106 and 107. The $GPU_1$ 106 may calculate the partial support $PS_1$ 113 of a candidate k-itemset corresponding to the relative memory address $RA_1$ based on the relative memory address $RA_1$ and the block $TB_1$ copied to the device memory 108. Similarly, the $GPU_2$ 107 may calculate the partial support $PS_2$ 114 of a candidate k-itemset corresponding to the relative memory address $RA_2$ based on the relative memory address and the block $TB_1$ copied to the device memory 109. The frequent pattern mining apparatus may copy the partial supports $PS_1$ 113 and $PS_2$ 114 calculated by the GPUs 106 and 107 to the main memory 105. The frequent pattern mining apparatus may update the supports of the candidate k-itemsets based on the partial supports 113 and 114 copied to the main memory 105. The frequent pattern mining apparatus may mine frequent k-itemsets from the candidate k-itemsets by comparing the updated supports to a predefined minimum support. Calculation of the partial supports 113 and 114 and updating of the supports will be described further below.

"TFL Strategy"

The TFL strategy is a technique that mines frequent patterns from a first level, that is, $F_1$, of an enumeration tree. The frequent pattern mining apparatus may fast mine frequent itemsets for large-scale data using the TFL strategy. According to the TFL strategy, the frequent pattern mining apparatus may not keep a projected database (transaction data) and frequent itemsets of intermediate levels of the enumeration tree in a device memory of a GPU, but instead, may find all the frequent itemsets only using the first level $F_1$.

The frequent pattern mining apparatus may significantly reduce the usage of the device memory of the GPU through the TFL strategy, and thus deal with large-scale data without an out-of-memory problem. In order to get rid of data transfer overhead between a main memory and the device memory of the GPU, the frequent pattern mining apparatus may perform pattern mining simultaneously during streaming transaction data from the main memory to the device memory of the GPU. Streaming may include a concept of streaming copy. The frequent pattern mining apparatus may solve the workload skewness using a block-based streaming approach. Hereinafter, the transaction blocks, the block-based streaming approach, and an algorithm of the TFL strategy will be described.

"Transaction Blocks"

FIG. 2 illustrates transaction blocks according to an example embodiment.

It is important to make data structures simple and cause a regular memory access pattern for fully exploiting the computational power of GPUs in terms of workload balancing among thousands of GPU cores and coalesced memory access. Arithmetic and logic units (ALUs) and a memory scheme of the GPUs may be inefficient for handling complex and variable-size data structures including sets, lists, maps, and combinations thereof, compared with those of CPUs. Furthermore, the GPUs may only have limited device memories, and the limited size of the memories may be a major obstacle for frequent itemset mining on large-scale and/or dense datasets using the GPUs.

With considering computational efficiency, the frequent pattern mining apparatus may adopt a vertical bitmap layout for data representation. A horizontal layout and a vertical layout may be too complex and irregular to maximize the computational efficiency of the GPUs. Referring to FIG. 2, transaction data 201 represented by the horizontal layout being a horizontal format is illustrated.

In an example, the frequent pattern mining apparatus may perform bitwise AND operations among large-scale bitmaps using the vertical bitmap layout. The frequent pattern mining apparatus may perform the bitwise AND operations using the GPUs, and thus have an overwhelming advantage over the CPUs in terms of performance. The frequent pattern mining apparatus may use the vertical bitmap layout, and thus partition an input database into sub-databases, each may fit in the main memory or the device memory of the GPU.

Input data D represented by the vertical bitmap layout will be referred to as a transaction bitmap. The frequent pattern mining apparatus may mine frequent 1-itemsets $F_1$ from the transaction data, and record the frequent 1-itemsets $F_1$ in a database as the transaction bitmap represented by the vertical bitmap layout.

Referring to FIG. 2, a transaction bitmap 202 may include bit vectors corresponding to the frequent 1-itemsets, and be represented by the vertical bitmap layout. For example, a bit vector corresponding to a frequent 1-itemset A may be {100111001010}. In an example, the frequent pattern mining apparatus may obtain or directly generate the transaction bitmap including the bit vectors of $F_1$.

In an example, the frequent pattern mining apparatus may vertically partition the transaction bitmap 202 by a predefined size. The frequent pattern mining apparatus may generate transaction blocks $TB_1$ 203, $TB_2$ 204 and $TB_3$ 205 based on the vertically partitioned transaction bitmap. The frequent pattern mining apparatus may generate the transaction blocks in view of sizes of the device memories of the GPUs. Hereinafter, "Definition 1" defines vertical partitioning of a transaction bitmap.

Definition 1. (Transaction Bitmap Partitioning)

Transaction bitmap partitioning is vertically dividing a transaction bitmap TB into R non-overlapping partitions of the same width. Here, the partitions are denoted by $TB_{1:R}$, where $TB_k$ indicates a k-th partition of the transaction bitmap ($1 \le k \le R$).

A transaction block generated by vertical partitioning refers to a partition generated by the transaction bitmap partitioning of "Definition 1". The k-th transaction block among $TB_{1:R}$ may be denoted by $TB_k$. The frequent pattern mining apparatus may start mining from the frequent 1-itemsets $F_1$, and thus the size of TB may be $|F_1| \times |D|$ in bits. Here, $|D|$ denotes the total number of transactions. For example, in the transaction bitmap 202 of FIG. 2, $|F_1|=7$ and $|D|=12$. The width of a single partition of the transaction bitmap may be denoted by W. The size of $TB_k$ may become $|F_1| \times W$. In the example of FIG. 2, W of a transaction block being a partition may be "4". Thus, the size of the transaction block $TB_1$ 203 may be $7 \times 4$. If the width of the last partition $TB_R$, among $TB_{1:R}$, is less than W, the frequent pattern mining apparatus may perform preprocessing of padding at least one "0" to $TB_R$ to guarantee the width of W for the transaction blocks.

In an example, the frequent pattern mining apparatus may set the parameter W to a small size enough to fit each $TB_k$ in the device memory of the GPU. The frequent pattern mining apparatus may allocate each transaction block consecutively to the main memory, or store each transaction block as a chunk in a secondary storage like a disk page. Although an example in which the transaction bitmap is represented by the vertical format is described, the frequent pattern mining apparatus may generate the transaction blocks by partitioning a transaction represented by a horizontal format in view of the design intent, system environment or efficiency. Although an example of partitioning the transaction bitmap into transaction blocks of the same width is described, the frequent pattern mining apparatus may also generate transaction blocks of different widths in view of the design intent, system environment or efficiency.

A frequent 1-itemset x ($x \in F_1$) may have a bit vector of the length $|D|$ in TB. Referring to FIG. 2, a frequent 1-itemset $\{A\}$ may correspond to a bit vector "100111001010" of which the length is "12". TB may be divided into R bit vectors of the length W by vertical partitioning. A bit vector of x within $TB_k$ may be denoted by $TB_k(x)$. Referring to FIG. 2, $TB_1(\{A\})$ may be "1001". As described above, TB may contain only bit vectors for frequent 1-itemsets. Thus, if x is a frequent n-itemset, x may have n bit vectors in $TB_k$, that is, $\{TB_k(i) | i \in x\}$. Hereinafter, "Definition 2" defines a concept of a set of physical pointers to bit vectors for a frequent itemset x in the transaction bitmap.

Definition 2. (Relative Memory Address)

A relative memory address of an item i is denoted by RA(i), and defined as a distance in bytes from a starting memory address of $TB_k$ to a starting memory address of $TB_k(i)$. A set of relative memory addresses of a frequent itemset x is denoted by RA(x), and defined as $\{RA(i) | i \in x\}$.

The concept of relative memory address may be for fast accessing to a memory location of an itemset (or memory locations of itemsets) within a single transaction block on the main memory or the device memory of the GPU. The frequent pattern mining apparatus may use RA(x) as a kind of an identifier for an itemset x. Let the number of items of x be |x|, and the number of distinct memory addresses of RA(x) be |RA(x)|. Then, $|x|=|RA(x)|$ since each item $i \in x$ may have its own unique memory address in $TB_k$. RA(x) for a frequent itemset x may not change across all $TB_k$ ($1 \le k \le R$), that is, may always have the same relative memory addresses since the size of $TB_k$ is fixed.

"Nested-Loop Streaming"

The frequent pattern mining apparatus may find frequent itemsets by repeating two major operations, candidate generation and testing (support counting), at each level of an itemset lattice. Between the two operations, the testing operation may be much more computationally intensive than the candidate generation operation. Thus, the frequent pattern mining apparatus may focus on accelerating the testing operation by exploiting the GPUs, and perform the candidate generation operation using the CPUs.

In an example, the frequent pattern mining apparatus may perform mining using a breadth-first search (BFS) traversal rather than a depth-first search (DFS) traversal in order to fully exploit massive parallelism of the GPUs and achieve better workload balancing. However, the frequent pattern mining apparatus may also use the DFS traversal according to the design intent or system efficiency.

When using the BFS traversal for pattern mining, the number of frequent itemsets at a certain level may be too large to be kept in a limited amount of the device memory of the GPU and used for support counting of candidate itemsets of the next level. An increase in the number of transactions may make the problem more difficult. However, the frequent pattern mining apparatus may solve the above problem using the TFL strategy.

The frequent pattern mining apparatus may mine frequent itemsets for large-scale datasets without degrading the performance within the limited device memory of the GPU. An entire set of frequent 1-itemsets may be referred to as the first level in the itemset lattice. Similarly, other levels in the itemset lattice may be referred to as intermediate levels. In a case in which frequent itemsets in intermediate levels are materialized in order to reduce computational overhead, a large amount of intermediate data may be generated and cause a lack of the main memory. Moreover, this tendency may be more marked when exploiting the GPUs since the capacity of the device memory of the GPU is more limited than that of the main memory.

The frequent pattern mining apparatus may test, using the TFL strategy, all candidate itemsets of intermediate levels only using the first level, that is, $F_1$. The GPU may have very strong computing power, especially for massive bitwise operations, but the device memory of the GPU may be relatively small compared with the main memory. Thus, the frequent pattern mining apparatus may perform mining only using $F_1$. In the GPU architecture, testing candidate (n+1)-itemsets using frequent 1-itemsets tends to be much faster than testing the candidate (n+1)-itemsets using frequent n-itemsets, that is, $F_n$. This is because copying $F_n$ to the device memory of the GPU may incur much larger data transfer overhead than copying $F_1$, and at the same time, accessing to $F_n$ in the device memory of the GPU may incur more non-coalesced memory access than accessing to $F_1$.

For mining large-scale data, a new itemset mining technique on the GPUs, called nested-loop streaming, is proposed. A single series of the candidate generation and testing operations may be referred to as an iteration. The frequent pattern mining apparatus may perform nested-loop streaming at each iteration. The frequent pattern mining apparatus may copy information of the candidate itemsets to the GPUs as outer operand by performing nested-loop streaming. In particular, the frequent pattern mining apparatus may copy relative memory addresses of candidate itemsets, instead of the candidate itemsets themselves, to the GPUs as outer operand.

Let candidate itemsets at the level L be $C_L$. The frequent pattern mining apparatus may copy $RA(C_L)=\{RA(x)|x \in C_L\}$ to the GPUs. If there is no ambiguity, $RA(C_L)$ may also be denoted simply by RA. The frequent pattern mining apparatus may also copy transaction blocks of the first level, that is, $TB_{1:R}$, to the GPUs as inner operand. Either the outer operand RA or the inner operand $TB_{1:R}$, or both may not fit in the device memory of the GPU. Thus, the frequent pattern mining apparatus may partition the outer operand RA into $RA_{1:Q}$ and copy each $RA_j$ to the GPUs one at a time ($1 \le j \le Q$). For each $RA_j$, the frequent pattern mining apparatus may stream each piece of the inner operand, that is, a transaction block $TB_k$, to the GPUs ($1 \le k \le R$). In most of intermediate levels, the size of the outer operand RA may be much smaller than that of the inner operand TB. In particular, when the entire RA may be kept in the device memory of the GPU, that is, Q=1, the frequent pattern mining apparatus may stream $TB_k$ to the GPUs.

For each pair of $\langle RA_j, TB_k \rangle$, the frequent pattern mining apparatus may calculate partial supports of $x \in RA_j$ within $TB_k$. Let the partial supports for $\langle RA_j, TB_k \rangle$ be $PS_{j,k}$. Definition 3 defines a partial support of an itemset x.

Definition 3. (Partial Support)

$\sigma_x(TB_k)$ is defined as a partial support of an itemset x within a given transaction block $TB_k$. The whole support of x on the whole transaction bitmap $TB_{1:R}$ becomes $\sigma(x) = \sum_{k=1}^{R} \sigma_x(TB_k)$.

In order to calculate the partial support $\sigma_x (TB_k)$ for an itemset $x = \{i_1, \ldots, i_n\}$, the frequent pattern mining apparatus may perform a bitwise AND operation (n−1) times among bit vectors of $\{TB_k(i)|i \in x\}$ and count the number of "1"s in the resultant bit vector. The frequent pattern mining apparatus may efficiently access to locations of the bit vectors $TB_k(x)$ since RA(x) contains relative memory addresses of x in $TB_k$ on the device memory of the GPU. A function to apply a series of (n−1) bitwise AND operations for the itemset x is denoted by $\cap\{TB_k(x)\}$. Further, a function to count the number of "1"s in a given bit vector is denoted by count(·). Then, $\sigma_x(TB_k) = count(\cap\{TB_k(x)\})$.

"TFL Algorithm"

Figure 3:
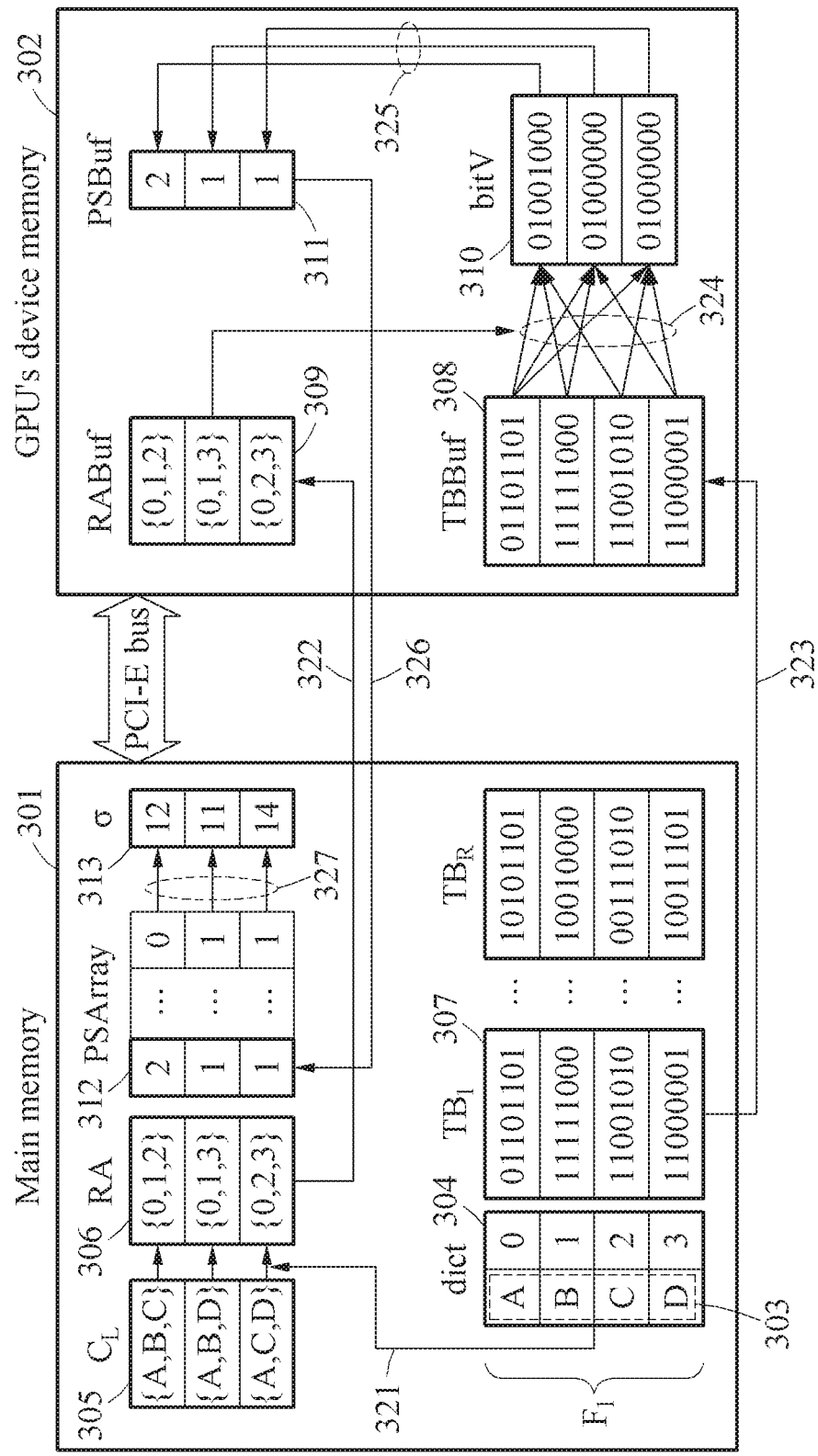
FIG. 3 illustrates an operation of a traversal from the first level (TFL) strategy according to an example embodiment.

FIG. 3 illustrates an operation of a TFL strategy according to an example embodiment.

A frequent pattern mining apparatus may use an algorithm of the TFL strategy. The overall procedure of the algorithm of the TFL strategy will be described with reference to FIG. 3. Referring to FIG. 3, it may be assumed that outer operand $RA_{1:Q}$ and inner operand $TB_{1:R}$ are in a main memory 301, and Q=1 for ease of description. A buffer for $RA_j$, denoted by RABuf, and a buffer for $TB_k$, denoted by TBBuf, may be in a device memory 302 of a GPU. A set of candidate itemsets at the current level in the itemset lattice may be denoted by $C_L$.

The frequent pattern mining apparatus may map each itemset x in $C_L$ 305 to a relative memory address RA(x) using a dictionary dict 304, and convert $C_L$ 305 to RA 306 based on a mapping result. Here, the dictionary dict 304 is a dictionary that maps a frequent 1-itemset $x \in F_1$ to RA(x) within a transaction block $TB_k$. If the size of RA is larger than that of RABuf in the device memory 302 of the GPU, then RA may be logically divided into Q partitions, that is, $RA_{1:Q}$, such that each partition may fit in RABuf.

In operation 321, the frequent pattern mining apparatus may generate the relative memory addresses RA 306 of the candidate k-itemsets $C_L$ 305 using the dictionary dict 304 that maps frequent 1-itemsets $F_1$ 303 of a transaction bitmap to relative memory addresses. The frequent pattern mining apparatus may identify frequent 1-itemsets included in a candidate k-itemset, and generate a relative memory address of the candidate k-itemset by combining the relative memory addresses of the identified frequent 1-itemsets. For example, the dictionary dict 304 may include relative memory addresses, for example, indices, corresponding to the frequent 1-itemsets 303. The frequent pattern mining apparatus may generate a relative memory address {0,1,2} of a candidate 3-itemset {A,B,C} by combining "0", "1", and "2" recorded in the dictionary dict 304.

The frequent pattern mining apparatus may copy each $TB_k$ to TBBuf in a streaming fashion via a PCI-E bus, after copying $RA_j$ to RABuf. In an example, the frequent pattern mining apparatus may copy the relative memory addresses to device memories of the GPUs as outer operand. In operation 322 of FIG. 3, since it may be assumed that Q=1 and the single device memory 302 is provided, the frequent pattern mining apparatus may copy the relative memory addresses RA 306 to RABuf in the device memory 302 of the GPU as outer operand.

In an example, the frequent pattern mining apparatus may copy one of the transaction blocks to the device memories of the GPUs as inner operand. In operation 323 of FIG. 3, the frequent pattern mining apparatus may copy $TB_1$ 307 among the transaction blocks to TBBuf in the device memory 302 of the GPU.

In order to store partial supports for all candidate itemsets in RA 306 in each transaction block $TB_k$, the frequent pattern mining apparatus may maintain a two-dimensional array, denoted by PSArray, in the main memory 301, and the size of the two-dimensional array may be determined by |RA|. Here, |RA| denotes the number of candidate itemsets. The frequent pattern mining apparatus may allocate the buffer for partial support, denoted by PSBuf, in the device memory 302 of the GPU.

In an example, the GPUs may calculate partial supports corresponding to the relative memory addresses using the transaction block and the relative memory addresses copied to the device memories. The GPUs may calculate partial supports 311 for candidate itemsets 309 in RABuf using a GPU kernel function for bitwise AND operations, denoted by $K_{TFL}$, and store the partial supports 311 in PSBuf. In operation 324 of FIG. 3, since it may be assumed that Q=1 and the single device memory 302 is provided, the frequent pattern mining apparatus may calculate bit vectors 310 corresponding to the relative memory addresses 309 through the GPU using a transaction block 308 copied to TBBuf and the relative memory addresses 309 copied to RABuf. In operation 325, the frequent pattern mining apparatus may calculate the partial supports 311 corresponding to the relative memory addresses 309 from the bit vectors 310 corresponding to the relative memory addresses 309, and record the calculated partial supports 311 in PSBuf.

In an example, the frequent pattern mining apparatus may update the supports of the candidate k-itemsets by synchronizing the partial supports corresponding to the relative memory addresses. Referring to FIG. 3, the frequent pattern mining apparatus may first store the partial supports calculated on the GPU cores in PSBuf in the device memory 302 of the GPU, and then copy the partial supports 311 in PSBuf back to PSArray in the main memory 301. Here, the frequent pattern mining apparatus may copy the partial supports for $TB_k$ to a k-th column of PSArray. In operation 326, the frequent pattern mining apparatus may copy the partial supports 311 recorded in PSBuf to PSArray. In operation 327, the frequent pattern mining apparatus may update supports 313 of $C_L$ 305 by synchronizing the partial supports corresponding to RA 306.

The frequent pattern mining apparatus may aggregate the partial supports of each itemset x in PSArray for getting $\sigma(x)$. The frequent pattern mining apparatus may find frequent L-itemsets $F_L$ of which supports are greater than or equal to a given threshold minsup.

---

Algorithm 1: The TFL strategy

Input : D;/* transaction database */
Input : minsup;/* minimum support */
Output : F;/* frequent itemsets */
1 Load D into MM;
2 Allocate PSArray on MM;

Algorithm 1: The TFL strategy

```
 3  Allocate {TBBuf, RABuf, PSBuf} on DM;
 4  F₁ ← find all frequent 1-itemsets;
 5  Build TB₁:R using D and F₁ on MM;
 6  dict ← dictionary mapping x to RA(x)(x ∈ F₁);
 7  L ← 1;
 8  while |F_L| > 0 do
 9  |   L ← L + 1;
    |   /* Generating candidates using CPUs */
10  |   C_L ← generate candidate itemsets using F_{L-1};
11  |   Convert C_L to RA_{1:Q} using dict;
    |   /* Testing using GPUs */
12  |   for j ← 1 to Q do
13  |   |   Copy RA_j into RABuf of DM;
14  |   |   for k ← 1 to R do
15  |   |   |   Copy TB_k into TBBuf of DM;

16  |   |   |
                Call K_{TFL}(RA_j, TB_k);/* ⌈|RA_j|/maxBlK⌉ times*/

17  |   |   |   Copy PSBuf into PSArray of MM;
18  |   Thread synchronization of GPUs;
19  |   σ(c) ← Σ_{k=1}^{R} PSArray[c][k], for ∀c ∈ C_L;
20  |   F_L ← {c|c ∈ C_L ∧ σ(c) ≥ minsup};
21  F ← ∪ F_L;
22  Return F;
```

Algorithm 1 shows the pseudocode of the algorithm of the TFL strategy. As an initialization operation, the frequent pattern mining apparatus may load transaction data D into the main memory MM, allocate PSArray on MM, and allocate three buffers, TBBuf, RABuf and PSBuf, on the device memory DM of the GPU (Lines 1-3). Then, the frequent pattern mining apparatus may convert D to a set of transaction blocks $TB_{1:R}$ using $F_1$ such that each transaction block may fit in TBBuf (Lines 4-5). The frequent pattern mining apparatus may build a dictionary dict for mapping x to RA(x) (Line 6). The dictionary may be not changed during itemsets mining since the TFL strategy may only use $TB_R$ built for $F_1$ as input data. A main loop may include generating operation (Lines 10-11) and testing operation (Lines 12-20). The frequent pattern mining apparatus may significantly improve the performance of testing operation by streaming transaction blocks of $F_1$ for overcoming the limitation on the amount of GPU memory, and at the same time, exploit GPU computing for fast and massively parallel calculation of partial supports (Lines 12-18).

The frequent pattern mining apparatus may usually call the kernel function $K_{TFL}$ multiple times, instead of a single time (Line 16). This is due to a limit on the number of GPU blocks, which may be decided by the frequent pattern mining apparatus when calling $K_{TFL}$. The $K_{TFL}$ function may calculate a partial support of a single itemset using a single GPU block. For example, if the number of GPU blocks, denoted by maxBlk, is set to 16K, a single call of $K_{TFL}$ may calculate partial supports for 16K itemsets once. Thus, if $|RA_j|=100M$, then the $K_{TFL}$ function may be called $$\left\lceil \frac{100\ M}{16\ K} \right\rceil \approx 6{,}250\ \text{times.}$$

That is, for the same transaction block $TB_k$ in TBBuf, the frequent pattern mining apparatus may execute the kernel function repeatedly while changing portions of $RA_j$. In terms of copying data, RA may become outer operand, while TB may become inner operand. However, in terms of calling the kernel function, $TB_k$ may become inner operand, while $RA_j$ may become outer operand.

Algorithm 2: KTFL: Kernel function for partial supports

```
Input : RA_j;/* j-th partition of RA */
Input : TB_k;/* k-th transaction block */
Input : doneIdx;/*index of last candidates done in RA_j */
Input : maxThr;/*max number of threads in GPU block*/
Variable: can;/* shared variable for a candidate */
Variable: sup;/* shared variable for a partial support */
1  if doneIdx + BID ≥ |RA_j| then
2  |   return;
3  can ← RA_j[doneIdx + BID];
4  sup[0 : maxThr] ← 0;

5
    for i ← 0; i < W/(maxThr*32); i ← i + 1 do

6  |   bitV ← ∩_{i∈can} TB_k[i][w * maxThr + TID];
7  |   sup[TID] ← sup[TID] + popCount(bitV);
8  |   syncthreads( );
9  PSBuf[doneIdx + BID] ← parallelReduction (sup[ ]);
```

Algorithm 2 presents the pseudocode of the GPU kernel function of GMiner. The kernel function of Algorithm 2 may be used in not only the TFL strategy, but also the HIL strategy. $RA_j$, $TB_k$, doneIdx and maxThr may be used as inputs. Here, doneIdx denotes an index of the last candidate done in $RA_j$, and may be required for identifying the portion of $RA_j$ to be processed by the current call of $K_{TFL}$. For example, if $|RA_j|=10000$ and maxBlk=1000, doneIdx in the second call of $K_{TFL}$ may become 1000. The input maxThr is the maximum number of threads in a single GPU block, which may be decided when calling $K_{TFL}$ like maxBlk. BID and TID are IDs of the current GPU block and GPU thread, respectively, which are system variables automatically determined. Since a lot of GPU blocks may be executed concurrently, some of the GPU blocks may have no corresponding candidate itemsets to test. For instance, if $|RA_j|=100$ and maxBlk=200, 100 GPU blocks should not perform the kernel function since the GPU blocks have no itemsets. Thus, if the current GPU block has no such itemset, the kernel function may return immediately (Lines 1-2). The kernel function may prepare two variables, can and sup, in a shared memory of the GPU for better performance, since the two variables may be frequently accessed. The variable can may contain an itemset of which a partial support is calculated by the current GPU block BID, and the vector sup may be initialized with "0".

Figure 4:
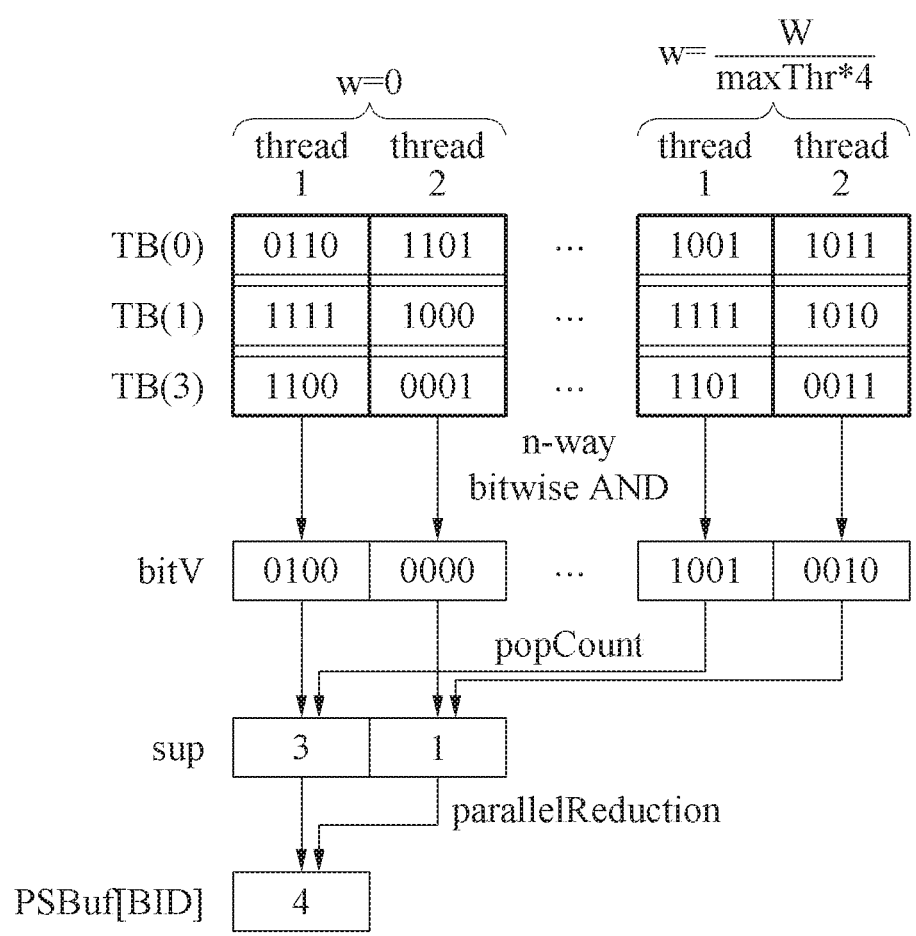
FIG. 4 illustrates a kernel function according to an example embodiment.

FIG. 4 illustrates a kernel function according to an example embodiment.

The main loop of $K_{TFL}$ may perform bitwise AND operations simultaneously and repeatedly (Lines 5-8). Under the current architecture of GPUs, a single GPU thread may efficiently perform bitwise AND for single-precision width, that is, 32 bits. That is, a single GPU block may perform bitwise AND up to maxThr×32 bits simultaneously. The width W of a transaction block may be much larger than maxThr×32 bits.

Referring to FIG. 4, an example of $K_{TFL}$ when maxThr=2, and can=0, 1, 3 is illustrated. Here, it may be assumed that a GPU thread may perform bitwise AND for 4 bits for simplicity. Since the length of a candidate itemset is "3", the thread 1 and 2 may perform bitwise AND operations two times over {TB(0), TB(1), TB(3)} and store the resultant bits in bitV. The kernel may repeat this process $$\frac{W}{maxThr*32}\ \text{times.}$$

The number of "1"s in bitV may be easily counted using so-called the popCount function and stored in the sup vector. A name of the popCount function may be popc( ). Partial supports may be accumulated in the sup vector $$\frac{W}{maxThr*32} \text{ times,}$$

as in FIG. 4. The kernel function may aggregate the partial supports in sup into a single partial support within $TB_k$ for a candidate itemset can by using a parallelReduction function (Line 9).

"HIL Strategy"

The above TFL strategy may find all frequent itemsets for large-scale database only using GPUs having limited amounts of GPU memories (device memories). Although the TFL strategy may show the overwhelming performance in most cases, a strategy showing a satisfactory performance even in the case that the lengths of frequent itemsets become long may be required. Thus, the suggested one is the HIL strategy that makes the performance of testing operation more scalable in terms of the lengths of itemsets by utilizing fragment blocks.

"Fragment Blocks"

FIG. 5 illustrates fragment blocks according to an example embodiment.

The HIL strategy may horizontally partition each transaction block $TB_k$ into disjoint fragment blocks. The size of a fragment may be defined as the number of frequent 1-itemsets belonging to a single fragment block. The size of the fragment may be fixed, and denoted by H. Thus, there may be a total of $$S = \left\lceil \frac{|F1|}{H} \right\rceil$$

fragment blocks in each transaction block.

According to the HIL strategy, the frequent pattern mining apparatus may materialize all frequent itemsets within each fragment block. Here, materialization of an itemset x refers to generation of a bit vector for x in the corresponding fragment block. Since the size of the fragment is H, up to a total of $2^{|H|}-1$ frequent itemsets may be materialized in each fragment block. Thus, the height of the fragment block may be set to $2^{|H|}-1$, instead of H.

According to the HIL strategy, the frequent pattern mining apparatus may vertically and horizontally partition a transaction bitmap TB into fragment blocks, and each fragment block may have the width of W and the height of $2^{|H|}-1$. A fragment block may have its own ID within a transaction block, denoted by FID. The frequent pattern mining apparatus may consecutively allocate each fragment block in the main memory or stored as a chunk in a secondary storage like a disk page. An l-th fragment block of $TB_k$ may be denoted by $TB_{k,l}$. A fragment block $TB_{k,l}$ may include $2^{|H|}-1$ bit vectors, and a set of itemsets corresponding to those bit vectors may be denoted by itemsets $(TB_{k,l})$.

Referring to FIG. 5, a total of R×3 fragment blocks are illustrated, and here H=2. In an example, the frequent pattern mining apparatus may generate fragments 502, 503 and 504 by partitioning frequent 1-itemsets 501. The frequent pattern mining apparatus may generate itemsets 505, 506 and 507 being all combinations of frequent 1-itemsets in each of the fragments 502, 503 and 504. For example, the frequent pattern mining apparatus may generate the itemset 506 of {C}, {D} and {C, D} being all combinations of frequent 1-itemsets {C} and {D} in the fragment 2 503. The frequent pattern mining apparatus may calculate bit vectors corresponding to the itemsets 505, 506 and 507. Here, a transaction bitmap including bit vectors may be represented by a vertical bitmap layout, and the frequent pattern mining apparatus may generate fragment blocks $TB_{1,1}$ 509, $TB_{1,2}$ 510, $TB_{1,3}$ 511, $TB_{R,1}$ 512, $TB_{R,2}$ 513 and $TB_{R,3}$ 514 by vertically partitioning the transaction bitmap including the bit vectors and dividing the transaction bitmap for each of the fragments 502, 503 and 504. For example, the transaction block $TB_1$ may be partitioned into three fragment blocks {$TB_{1,1}$, $TB_{1,2}$, $TB_{1,3}$}, and each fragment block may include $2^2-1=3$ bit vectors. In FIG. 5, itemsets corresponding to $TB_{1,2}$ may be {{C}, {D}, {CD} }. According to the HIL strategy, the bit vectors of n-itemsets (n>1) in a fragment block may be initialized with "0"s before materialization.

In terms of space complexity, the HIL strategy may require a space of $$O\left(\frac{|F1|}{H} \times (2^H - 1) \times |D|\right)$$

in bits for a transaction bitmap. Compared with full materialization of frequent itemsets at intermediate levels, the fragment blocks according to the HIL strategy may take a much smaller amount of memory. For example, it may be assumed that |D|=10M and $|F_1|$=500. Then, full materialization up to third levels may require a space of up to $$\left(\binom{500}{1}+\binom{500}{2}+\binom{500}{3}\right) \times 10{,}000{,}000 \approx 23 \text{ TBytes.}$$

In contrast, according to the HIL strategy, the fragment blocks with H=5 may only require a space of $$\frac{500}{5} \times (2^5 - 1) \times 10{,}000{,}000 \approx 3.6 \text{ GBytes.}$$

For materialization, the frequent pattern mining apparatus according to the HIL strategy may perform frequent itemset mining from 2 to H levels for each of R×S fragment blocks. The number of fragment blocks may increase greatly as the size of database increases. For fast materialization of a large number of blocks, the nested-loop streaming technique described above may be utilized. Since the fragment blocks are not correlated with each other, the fragment blocks may be materialized independently.

---

Algorithm 3: Materialize fragment blocks

Input : T B1:R,1:S; /* fragment blocks */
1  Q ← integer value satisfying S/Q × ($2^{|H|}$ − 1) < |RABuf|;
2  for j ← 1 to Q do
3      start ← (j − 1) × S/Q + 1;
4      end ← j × S/Q;
5      $F_H$ ← $\cup_{l=begin}^{l=end}$ itemsets($TB_{j,l}$);
6
7      dict ← dictionary mapping x to RA(x) (x ∈ $F_H$);
8      Convert $F_H - F_1$ to $RA_j$ using dict;
9      Copy $RA_j$ into RABuf of DM;

| Algorithm 3: Materialize fragment blocks |
| --- |
| 10       for k ← 1 to R do |
| 11         |Copy $TB_{k,[start:end]}$ into T BBuf of DM; |
| 12         |Call $K_{HIL}(RA_j, TB_{k,[start:end]})$; |
|            |Copy $TB_{k,[start:end]}$ on DM back to MM; |
| 13 Thread synchronization of GPUs; |

Algorithm 3 presents an algorithm for materialization of fragment blocks. All fragment blocks may be used as inputs. The frequent pattern mining apparatus may first calculate the maximum number of fragment blocks that may be materialized at once using RABuf on a device memory DM (Line 1). Here, it may be assumed that the calculated maximum number is Q. Then, the frequent pattern mining apparatus may execute a main loop Q times. The frequent pattern mining apparatus may stream the fragment blocks of FIDs between a start and an end of all transaction blocks, that is, $FB_{1:R, begin:end}$. That is, a total of R×S/Q fragment blocks may be transferred to the GPU memory (device memory) in a streaming fashion. For mapping the itemsets in those blocks to their relative memory addresses, the frequent pattern mining apparatus may build a dictionary dict (Lines 5-6). Then, the frequent pattern mining apparatus may only map the itemsets for $F_H$–$F_1$ since materialization of $F_1$ is unnecessary (Line 7). The frequent pattern mining apparatus may execute the kernel function $K_{HIL}$ simultaneously during streaming fragment blocks (Lines 9-12). Here, $K_{HIL}$ may be basically the same as $K_{TFL}$, but may store the bit vectors bitV in the corresponding position in the fragment blocks in TBBuf, instead of calculating partial supports. The pseudocode of $K_{HIL}$ may be omitted. After calling $K_{HIL}$ is completed, the frequent pattern mining apparatus may copy updated fragment blocks $TB_{k, [start:end]}$ back to the main memory. This materialization scheme using GPU computing may be very fast, and so an elapsed time thereof may be almost negligible.

"HIL Algorithm"

Figure 6:
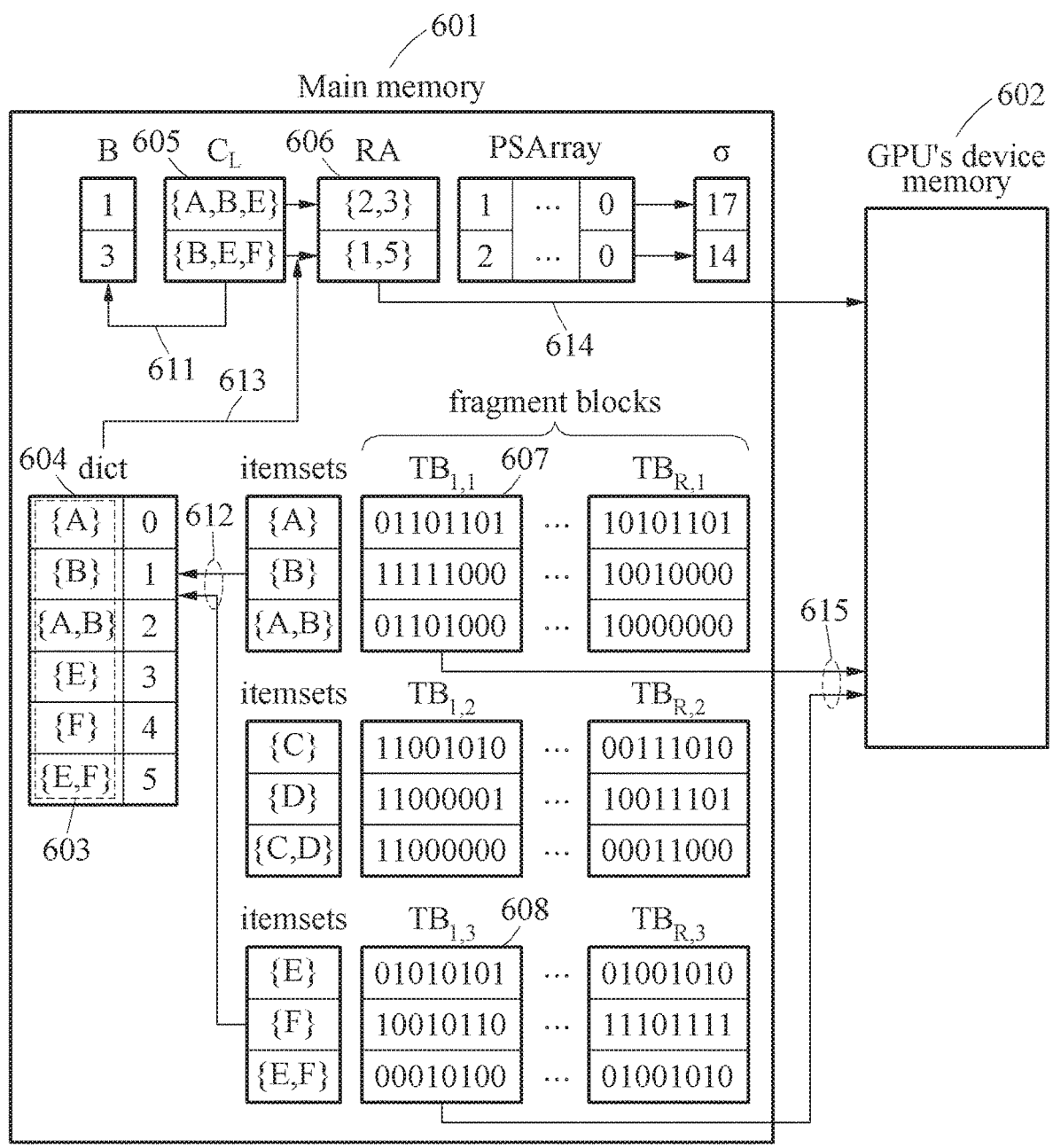
FIG. 6 illustrates an operation of a hopping from intermediate level (HIL) strategy according to an example embodiment.

FIG. 6 illustrates an operation of an HIL strategy according to an example embodiment.

According to the HIL strategy, the frequent pattern mining apparatus may reduce the number of bitwise AND operations by utilizing fragment blocks, which are a kind of pre-computed results. Different from the TFL strategy, the HIL strategy may decide a set of fragments at each level dynamically for reducing an amount of a transaction bitmap transferred to GPUs.

| Algorithm 4: HIL Algorithm |
| --- |
| Input  : D;/* transaction database */ |
| Input  : minsup;/* minimum support */ |
| Input  : H;/* fragment size */ |
| Output : F;/* frequent itemsets */ |
| /* Lines 1-4 in Algorithm 1 |
| 1 Build $TB_{1:R,1:S}$ using D, $F_1$, and H on MM; |
| 2 Materialize the fragment blocks of $TB_{1:R,1:S}$; |
| 3 L ← 1; |
| 4 while $|F_L| > 0$ do |
| 5   |  L ← L + 1; |
|     |  /* Generating candidates using CPUs */ |
| 6   |  $C_L$ ← generate candidate itemsets using $F_{L-1}$; |
| 7   |  B ← set of fragment blocks containing $C_L$; |
| 8   |  dict ← dictonary mapping x ∈ itemsets(B) to RA(x); |
| 9   |  Convert $C_L$ to $RA_{1:Q}$ using dict; |
|     |  /* Testing using GPUs */ |
| 10  |  for j ← 1 to Q do |

| Algorithm 4: HIL Algorithm |
| --- |
| 11  |  |  Copy $RA_j$ into RABuf of DM; |
| 12  |  |  for k ← 1 to R do |
| 13  |  |  |  Copy $TB_{k,j}$ into TBBuf of DM; |
| 14  |  |  |  Call $K_{TFL}(RAj, TB_{k,J\in B})$; |
| 15  |  |  |  Copy PSBuf into PSArray of MM; |
|    |  /* Lines 18-20 in Algorithm 1 |
| 16 F ← $UF_L$; |
| 17 Return F; |

Algorithm 4 presents the pseudocode of the HIL strategy. The frequent pattern mining apparatus may materialize fragment blocks using Algorithm 3 (Lines 1-2). After generating candidate itemsets $C_L$, the frequent pattern mining apparatus may find a minimal set of fragments, denoted by B, that contain all itemsets in $C_L$ (Line 7). When the level L is low, most of the fragments may be chosen as the set B. However, as the level L increases, the number of fragments containing $C_L$ may decrease, and so, the frequent pattern mining apparatus may reduce the overhead of transferring the fragment blocks. Since the set of fragments is changed at each level, relative memory addresses of the candidate itemsets in $C_L$ may also be changed. Thus, the frequent pattern mining apparatus may build a dictionary dict using only the itemsets in B at each level and convert $C_L$ to $RA_{1:Q}$ (Lines 8-9). When streaming a transaction bitmap to GPUs, the frequent pattern mining apparatus may copy only relevant fragment blocks $TB_{k,J\in B}$ instead of the entire transaction block $TB_k$.

Referring to FIG. 6, it may be assumed $C_L$={{A,B,E}, {B,E,F}} 605 according to the HIL strategy. In operation 611, the frequent pattern mining apparatus may easily identify fragments B={1, 3} containing all the itemsets in $C_L$ 605.

In operation 613, the frequent pattern mining apparatus may generate relative memory addresses 606 of the candidate k-itemsets 605 (for example, k=3) using a dictionary dic 604 that maps itemsets 603 of a transaction bitmap to relative memory addresses. For example, in operation 612, the frequent pattern mining apparatus may identify itemsets {A, B} and {E} included in a candidate k-itemset {A, B, E}. In operation 613, the frequent pattern mining apparatus may generate a relative memory address {2, 3} of the candidate k-itemset {A, B, E} by combining relative memory addresses of the itemsets {A, B} and {E}.

Referring to FIG. 6, the frequent pattern mining apparatus may build the dictionary dict using the first and third fragments, and so, RA({E}) may become "3" instead of "6". When converting an itemset x∈$C_L$ to RA(x), the length of RA(x) in the HIL strategy may become shorter than that in the TFL strategy. That is, a fewer number of bitwise AND operations may be required in the HIL strategy, than the TFL strategy, for getting partial supports. For example, the length of RA({A,B,E}) may be "2", that is, {2, 3} in the HIL strategy, whereas the length may be "3" in the TFL strategy.

In an example, the frequent pattern mining apparatus may copy the relative memory addresses as outer operand from the main memory to the device memories. In operation 614 of FIG. 6, the frequent pattern mining apparatus may copy the relative memory addresses 606 from a main memory 601 to a device memory 602 of a GPU. The frequent pattern mining apparatus may copy at least one of the fragment blocks as inner operand to the device memories. In operation 615 of FIG. 6, the frequent pattern mining apparatus may copy fragment blocks $TB_{1,1}$ 607 and $TB_{1,3}$ 608 among the fragment blocks to the device memory 602 of the GPU. As described above, each $RA_j$ may be copied to RABuf on the device memory 602 of the GPU, and then, the first set of fragment blocks {$TB_{1,1}$, $TB_{1,3}$} 607 and 608 in B may be streamed to TBBuf on the device memory 602 of the GPU. Next time, the second set of fragment blocks {$TB_{2,1}$, $TB_{2,3}$} may be streamed. As described with respect to the TFL strategy, the GPUs may calculate partial supports corresponding to the relative memory addresses using the fragment block and the relative memory addresses. The frequent pattern mining apparatus may update supports of the candidate k-itemsets by synchronizing the partial supports corresponding to the relative memory addresses. The description provided with respect to the TFL strategy is applicable to calculation and updating of the supports, and thus duplicate description will be omitted for conciseness.

"Exploiting Multiple GPUs"

Figure 7:
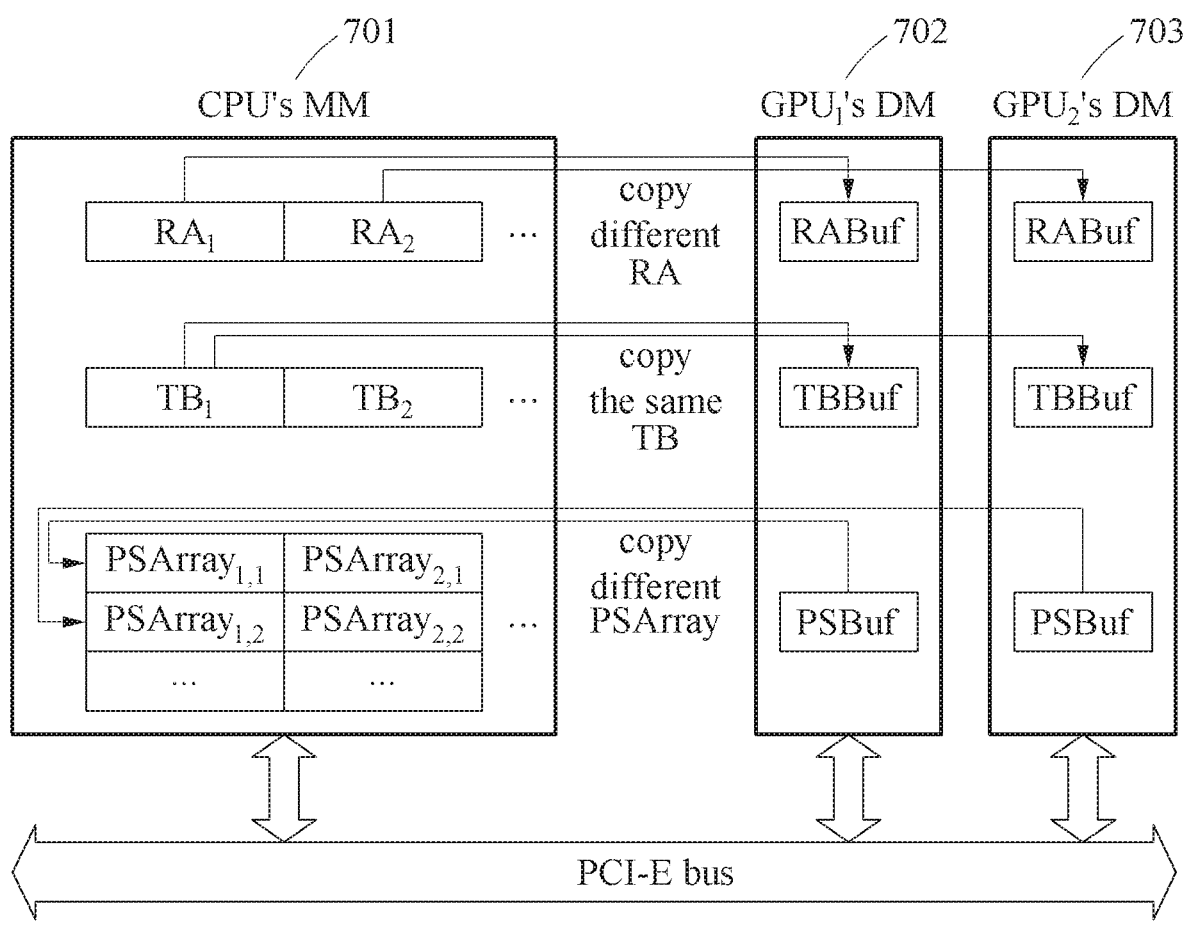
FIG. 7 illustrates an operation of exploiting multiple graphic processing units (GPUs) according to an example embodiment.

FIG. 7 illustrates an operation of exploiting multiple GPUs according to an example embodiment.

A GMiner-based frequent pattern mining apparatus may be easily extended to exploit multiple GPUs for further improving the performance. For exploiting multiple GPUs, the frequent pattern mining apparatus may copy a different portion of outer operand to different GPUs and copy the same transaction or fragment blocks to all the GPUs. This scheme may be referred to as a transaction bitmap sharing scheme. This scheme may be applied to both the TFL and HIL strategies.

Referring to FIG. 7, a data flow of a scheme using multiple GPUs is illustrated, and an example in which the number of GPUs is "2" is described. Here, the number of GPUs may be increased. The frequent pattern mining apparatus may copy $RA_1$ from a main memory 701 of a CPU to a device memory 702 of a $GPU_1$ and copy $RA_2$ from the main memory 701 of the CPU to a device memory 703 of a $GPU_2$. The frequent pattern mining apparatus may copy the same $TB_1$ to both the device memory 702 of the $GPU_1$ and the device memory 703 of the $GPU_2$. A kernel function on the $GPU_1$ may calculate partial supports in $RA_1$, while a kernel function on the $GPU_2$ may calculate partial supports in $RA_2$. Since $RA_1$ and $RA_2$ have no common itemsets, results of both the kernel functions may be copied back to PSArray in the main memory 701 without conflicts.

The frequent pattern mining apparatus may realize the scalability using the above scheme in terms of the number of GPUs since $RA_j$ and $RA_k$ are independent tasks (j≠k). In addition, the frequent pattern mining apparatus may solve workload imbalance of distributed and parallel computing methods using the above scheme. Amounts of computation for $RA_j$ and $RA_k$ may not be skewed as long as $RA_j$ and $RA_k$ have the same size, since the computation heavily relies on the number of bitwise AND operations without using complex or irregular data structures. Therefore, regardless of the characteristics of datasets used, the frequent pattern mining apparatus may show the stable speed-up ratio using multiple GPUs.

Figure 8:
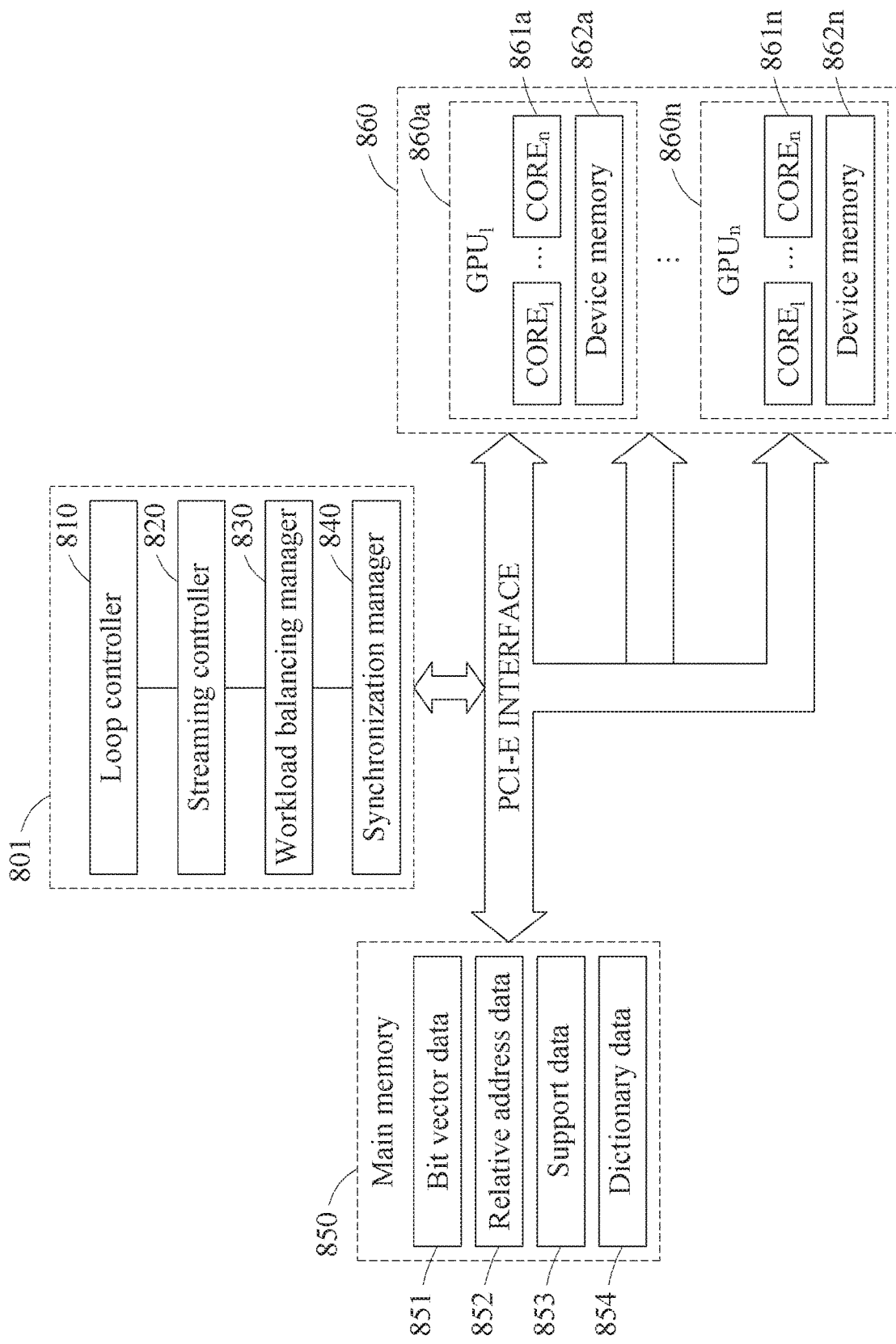
FIG. 8 illustrates a configuration of a frequent pattern mining apparatus according to an example embodiment.

FIG. 8 illustrates a configuration of a frequent pattern mining apparatus according to an example embodiment.

Referring to FIG. 8, a frequent pattern mining apparatus may include a CPU 801, a main memory 850, and GPUs 860. Here, the CPU 801 and the GPUs 860 may be different independent entities, and the frequent pattern mining apparatus may be implemented by the CPU 801 or the GPUs 860. Data transmission among the CPU 801, the main memory 850, and the GPUs 860 may be performed through a PCI-E INTERFACE.

The CPU 801 may include a loop controller 810, a streaming controller 820, a workload balancing manager 830, and a synchronization manager 840. The loop controller 810 may perform loop related to operations such as nested-loop streaming, the streaming controller 820 may perform streaming related to operations, the workload balancing manager 830 may perform workload balancing related to operations such as generation of the transaction blocks or the fragment blocks, and the synchronization manager 840 may perform synchronization related to operations such as synchronization of the supports. The main memory 850 may store bit vector data 851, relative address data 852, support data 853, and dictionary data 854. The bit vector data 851 may be information related to the bit vectors, the relative address data 852 may be information related to the relative addresses, the support data 853 may be information related to the supports, and the dictionary data 854 may be information related to the dictionary.

The GPUs 860 may include a $GPU_1$ 860a through a $GPU_n$ 860n. The $GPU_1$ 860a may include cores 861a and a device memory 862a, and the $GPU_n$ 860n may include cores 861n and a device memory 862n. As described above, the $GPU_1$ 860a through the $GPU_n$ 860n may calculate partial supports. Hardware shown in FIG. 8 may perform the technique or strategies described above, and thus duplicate description will be omitted for conciseness.

Figure 9:
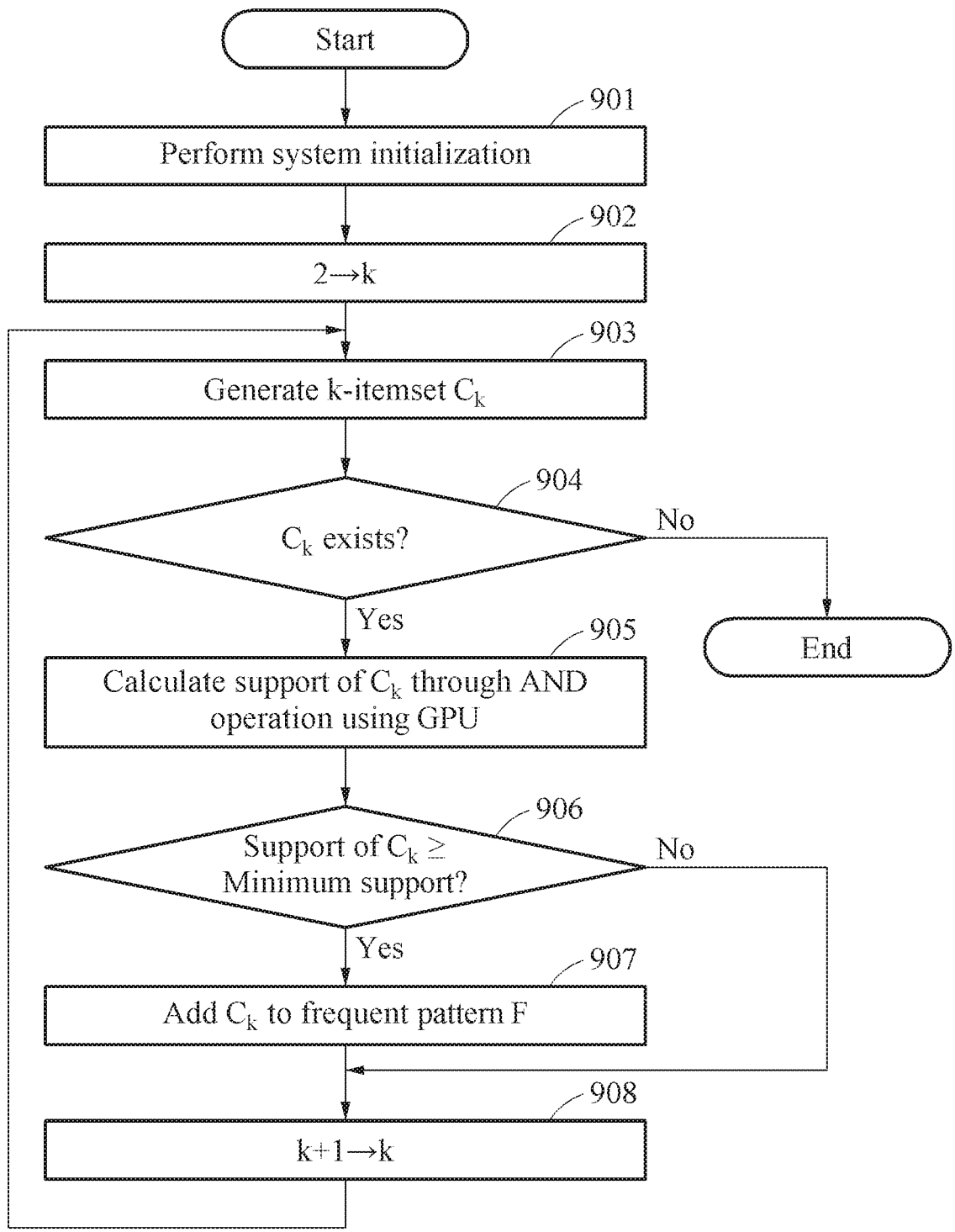
FIG. 9 is a flowchart illustrating a frequent pattern mining method according to an example embodiment.

FIG. 9 is a flowchart illustrating a frequent pattern mining method according to an example embodiment.

Referring to FIG. 9, in operation 901, a frequent pattern mining apparatus may perform a system initialization. The system initialization is an initialization operation for performing the TFL strategy or HIL strategy described above, and may include, for example, an operation of generating transaction blocks or fragment blocks, which will be described further with reference to FIG. 10.

In operation 902, the frequent pattern mining apparatus may set k to "2". In operation 903, the frequent pattern mining apparatus may generate a k-itemset $C_k$. In operation 904, the frequent pattern mining apparatus may determine whether $C_k$ exists. For example, in a case in which items A and B are provided, the frequent pattern mining apparatus may determine that $C_3$ does not exist, and terminate the operation.

In operation 905, the frequent pattern mining apparatus may calculate a support of $C_k$ through an AND operation using a GPU. The examples described above is applicable to the operation of calculating the support of $C_k$, and the operation will be described further with reference to FIGS. 11 and 12.

In operation 906, the frequent pattern mining apparatus may determine whether the support of $C_k$ is greater than or equal to a minimum support. In a case in which the support of $C_k$ is greater than or equal to the minimum support, the frequent pattern mining apparatus may add $C_k$ to a frequent pattern F, in operation 907. In a case in which the support of $C_k$ is less than the minimum support, the frequent pattern mining apparatus may generate a candidate itemset of the next level by substituting k+1 for k, in operation 908, and repeat the above operations.

Figure 10:
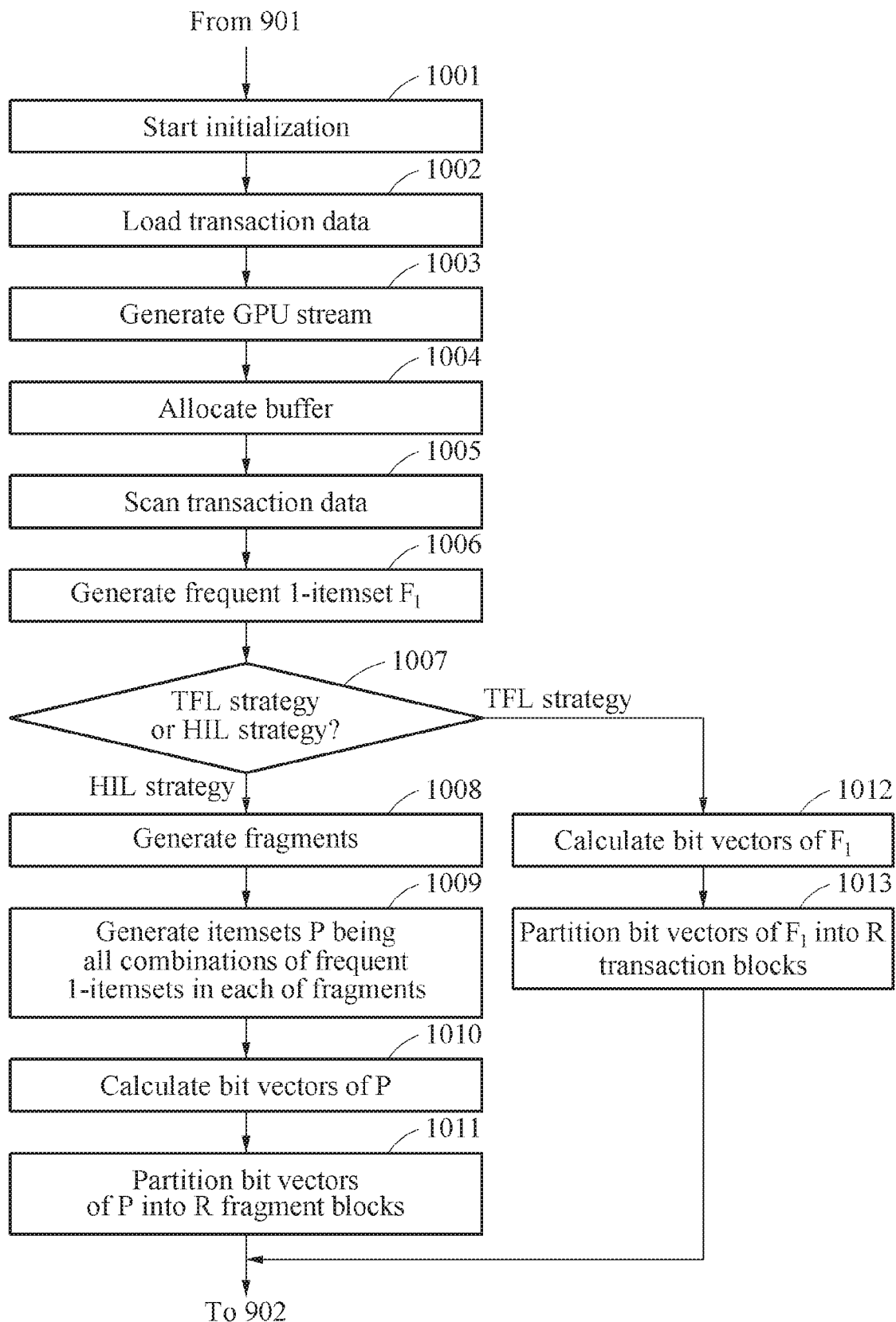
FIG. 10 is a flowchart illustrating a system initialization according to an example embodiment.

FIG. 10 is a flowchart illustrating a system initialization according to an example embodiment.

Referring to FIG. 10, in operation 1001, a frequent pattern mining apparatus may start an initialization. In operation 1002, the frequent pattern mining apparatus may load transaction data. In operation 1003, the frequent pattern mining apparatus may generate a GPU stream. For example, the frequent pattern mining apparatus may allocate a stream for processing a transaction or fragment block corresponding to a relative address to a GPU. In operation 1004, the frequent pattern mining apparatus may allocate a buffer. The buffers described above may be allocated to a main memory of a CPU or a device memory of the GPU.

In operation 1005, the frequent pattern mining apparatus may scan the transaction data. In operation 1006, the frequent pattern mining apparatus may generate frequent 1-itemsets $F_1$. The frequent pattern mining apparatus may mine the frequent 1-itemsets from the transaction data.

In operation 1007, the frequent pattern mining apparatus may select a TFL strategy or an HIL strategy. In a case in which the HIL strategy is selected, the frequent pattern mining apparatus may generate fragments from the frequent 1-itemsets, in operation 1008. In operation 1009, the frequent pattern mining apparatus may generate itemsets P being all combinations of frequent 1-itemsets in each of the fragments. In operation 1010, the frequent pattern mining apparatus may calculate bit vectors of P. In operation 1011, the frequent pattern mining apparatus may partition the bit vectors of P into R fragment blocks.

In a case in which the TFL strategy is selected, the frequent pattern mining apparatus may calculate bit vectors of $F_1$, in operation 1012. In operation 1013, the frequent pattern mining apparatus may partition the bit vectors of $F_1$ into R transaction blocks. The description provided above is applicable to the foregoing, and thus duplicate description will be omitted for conciseness.

Figure 11:
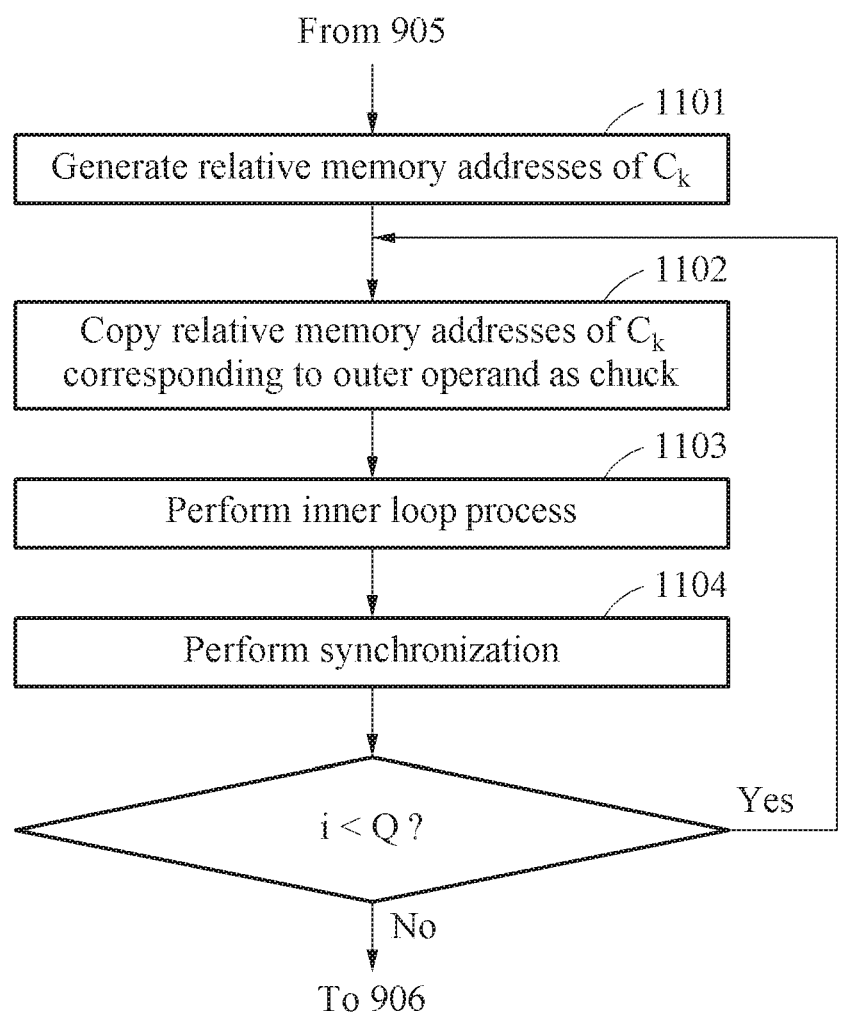
FIG. 11 is a flowchart illustrating an operation of calculating supports according to an example embodiment.

FIG. 11 is a flowchart illustrating an operation of calculating supports according to an example embodiment.

Referring to FIG. 11, in operation 1101, the frequent pattern mining apparatus may generate relative memory addresses of $C_k$. In operation 1102, the frequent pattern mining apparatus may copy the relative memory addresses of $C_k$ corresponding to outer operand to device memories of GPUs as a chunk. In operation 1103, the frequent pattern mining apparatus may perform an inner loop process. In operation 1104, the frequent pattern mining apparatus may synchronize partial supports copied from the GPUs. The inner loop process is a process of calculating a partial support using a GPU, which will be described further with reference to FIG. 12. The process of FIG. 11 may be referred to as an outer loop process.

The frequent pattern mining apparatus may determine whether i is less than Q, to determine whether synchronization of the partial supports corresponding to all the relative memory addresses $RA_j$ ($1 \leq j \leq Q$) is completed. In a case in which i is less than Q, the frequent pattern mining apparatus may repeat the operation of calculating and synchronizing the partial supports. In a case in which i is greater than or equal to Q, the frequent pattern mining apparatus may perform operation 906.

Figure 12:
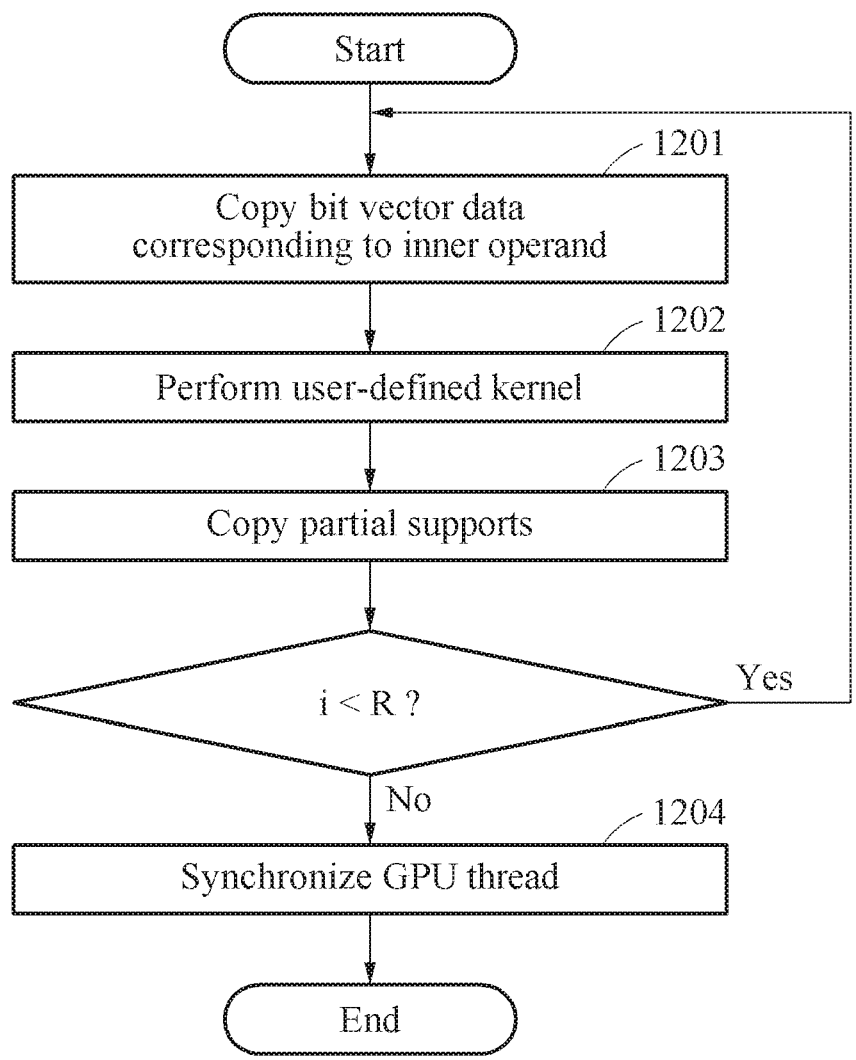
FIG. 12 is a flowchart illustrating an operation of calculating partial supports according to an example embodiment.

FIG. 12 is a flowchart illustrating an operation of calculating partial supports according to an example embodiment.

Referring to FIG. 12, in operation 1201, the frequent pattern mining apparatus may copy bit vector data corresponding to inner operand to device memories of GPUs. Here, the bit vector data may be the transaction blocks or fragment blocks described above. In operation 1202, the frequent pattern mining apparatus may perform a user-defined kernel using a GPU. Here, the user-defined kernel may be an operation using the kernel function described above.

In operation 1203, the frequent pattern mining apparatus may copy partial supports from the device memories of the GPUs to a main memory. The frequent pattern mining apparatus may determine whether i is less than R, to determine whether the partial supports corresponding to all the transaction blocks $TB_k$ ($1 \leq k \leq R$) are copied to the main memory. In a case in which i is less than R, the frequent pattern mining apparatus may repeat the operation of calculating and copying the partial supports. In a case in which i is greater than or equal to R, the frequent pattern mining apparatus may synchronize a GPU thread, in operation 1204. In a case in which a GPU processes all the transaction blocks corresponding to a single relative memory address, the frequent pattern mining apparatus may synchronize a thread of GPUs for processing the next relative memory address.

According to example embodiments, a frequent pattern mining method may fast deal with large-scale data by fully exploiting the computational power of GPUs, and at the same time, maximize the computational efficiency.

According to example embodiments, a frequent pattern mining method may provide a robust FIM technique without materializing intermediate data.

According to example embodiments, a frequent pattern mining method may fully exploit the GPU architecture and memory by performing a large amount of computation on a small amount of data, for example, by mining a frequent 1-itemset at a first level of an enumeration tree.

According to example embodiments, a frequent pattern mining method may improve the performance for datasets containing long patterns by performing a moderate amount of computation based on a moderate amount of data.

According to example embodiments, a frequent pattern mining method may solve the workload skewness by distributing relative memory addresses of candidate itemsets to GPUs and streaming transaction blocks to all the GPUs.

According to example embodiments, a frequent pattern mining method may solve the workload skewness, thereby improving the performance of mining linearly as the number of GPUs increases.

The units and/or modules described herein may be implemented using hardware components, software components, and/or combination thereof. For example, the hardware components may include microphones, amplifiers, band-pass filters, audio to digital convertors, and processing devices. A processing device may be implemented using one or more hardware device configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include plurality of processing elements and plurality of types of processing elements. For example, a processing device may include plurality of processors or a processor and a controller. In addition, different processing configurations are possible, such a parallel processors.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A frequent pattern mining method, comprising:
generating blocks from bit vectors corresponding to frequent 1-itemsets, by vertically partitioning a transaction bitmap including the bit vectors, the transaction bitmap being represented by a vertical bitmap layout, wherein each bit vector describes an occurrence of a different 1-itemset of a plurality of 1-itemsets in a plurality of data transactions being mined for frequent patterns, wherein each bit of a certain bit vector indicates an occurrence of a respective 1-itemset in a specific one of said plurality of data transactions and wherein each of said generated blocks comprises a different portion, of a pre-defined size, of each of the bit vectors;
copying relative memory addresses of candidate k-itemsets, from a main memory of a central processing unit (CPU) to device memories of graphic processing units (GPUs), by:
generating the relative memory addresses of the candidate k-itemsets using a dictionary that maps a frequent 1-itemset of the transaction bitmap to a relative memory address; and
copying the generated relative memory addresses to the device memories as outer operand;
copying at least one same block required for calculating supports of the candidate k-itemsets among the blocks, from the main memory to the device memories, by copying one of the blocks to the device memories as inner operand; and
updating the supports of the candidate k-itemsets by calculating, by the GPUs, partial supports corresponding to the relative memory addresses using the copied block and the relative memory addresses; and synchronizing the partial supports corresponding to the relative memory addresses calculated by the GPUs;
wherein the generating blocks from bit vectors comprises:
generating the blocks from bit vectors based on the size of the device memories of the GPU;
wherein said 1-itemset is defined as a set containing a single item;
wherein said k-itemset is defined as a set containing a plurality of items in a count of k; and
wherein said support is defined as a number of occurrences.

2. The frequent pattern mining method of claim 1, wherein the copying of the relative memory addresses comprises:
copying a relative memory address of a first candidate k-itemset to a device memory of a first GPU; and
copying a relative memory address of a second candidate k-itemset to a device memory of a second GPU,
wherein the copying of the at least one same block comprises:
copying a first block of the blocks to the device memory of the first GPU; and
copying the first block to the device memory of the second GPU.

3. The frequent pattern mining method of claim 1, wherein the generating of the relative memory addresses comprises:
identifying frequent 1-itemsets included in a candidate k-itemset; and
generating a relative memory address of the candidate k-itemset by combining relative memory addresses of the identified frequent 1-itemsets.

4. The frequent pattern mining method of claim 1, further comprising:
generating fragments by dividing the frequent 1-itemsets;
generating itemsets being all combinations of frequent 1-itemsets in each of the fragments;
calculating bit vectors corresponding to the generated itemsets; and
generating fragment blocks by vertically partitioning a transaction bitmap including the calculated bit vectors and dividing the transaction bitmap for each of the fragments, the transaction bitmap being represented by a vertical bitmap layout,
wherein the blocks are the fragment blocks.

5. The frequent pattern mining method of claim 4, wherein the copying of the relative memory addresses comprises:
generating the relative memory addresses of the candidate k-itemsets using a dictionary that maps an itemset of the transaction bitmap to a relative memory address; and
copying the generated relative memory addresses to the device memories as outer operand.

6. The frequent pattern mining method of claim 5, wherein the generating of the relative memory addresses comprises:
  identifying itemsets included in a candidate k-itemset; and
  generating a relative memory address of the candidate k-itemset by combining relative memory addresses of the identified itemsets.

7. A non-transitory computer-readable storage medium storing instructions that, when executed by a processor, cause the processor to perform the frequent pattern mining method of claim 1.

8. A frequent pattern mining method, comprising:
  mining frequent 1-itemsets from transaction data;
  generating transaction blocks by vertically partitioning a transaction bitmap including bit vectors corresponding to the frequent 1-itemsets, the transaction bitmap being represented by a vertical bitmap layout, wherein each bit vector describes an occurrence of a different 1-itemset of a plurality of 1-itemsets in a plurality of data transactions of the transaction data being mined for frequent patterns, wherein each bit of a certain bit vector indicates an occurrence of a respective 1-itemset in a specific one of said plurality of data transactions and wherein each of said generated blocks comprises a different portion, of a pre-defined size, of each of the bit vectors;
  calculating supports of candidate k-itemsets from the transaction blocks using graphic processing units (GPUs), by:
    generating relative memory addresses of the candidate k-itemsets using a dictionary that maps a frequent 1-itemset of the transaction bitmap to a relative memory address,
    copying the relative memory addresses to device memories of the GPUs as outer operand,
    copying one of the transaction blocks to the device memories as inner operand,
    calculating, by the GPUs, partial supports corresponding to the relative memory addresses using the copied transaction block and the relative memory addresses,
    updating the supports of the candidate k-itemsets by synchronizing the partial supports,
    copying a second transaction block to the device memories as inner operand,
    calculating, by the GPUs, second partial supports corresponding to the relative memory addresses using the copied second transaction block and the relative memory addresses and
    updating the supports of the candidate k-itemsets by synchronizing the second partial supports; and
  mining frequent k-itemsets based on the supports;
  wherein the generating transaction blocks comprises:
  generating the transaction blocks by vertically partitioning the transaction bitmap based on the size of the device memories of the GPU;
  wherein said 1-itemset is defined as a set containing a single item;
  wherein said k-itemset is defined as a set containing a plurality of items in a count of k; and
  wherein said support is defined as a number of occurrences.

9. A frequent pattern mining method, comprising:
  mining frequent 1-itemsets from transaction data;
  generating fragments by dividing the frequent 1-itemsets;
  generating itemsets being all combinations of frequent 1-itemsets in each of the fragments;
  calculating bit vectors corresponding to the generated itemsets, wherein each bit vector describes an occurrence of a different itemset of the generated itemsets in a plurality of data transactions of the transaction data being mined for frequent patterns, wherein each bit of a certain bit vector indicates an occurrence of a respective itemset in a specific one of said plurality of data transactions;
  generating fragment blocks by vertically partitioning a transaction bitmap including the calculated bit vectors and dividing the transaction bitmap for each of the fragments, the transaction bitmap being represented by a vertical bitmap layout;
  calculating supports of candidate k-itemsets from the fragment blocks using graphic processing units (GPUs), by:
    generating relative memory addresses of the candidate k-itemsets using a dictionary that maps an itemset of the transaction bitmap to a relative memory address,
    copying the relative memory addresses to device memories of the GPUs as outer operand,
    copying at least one of the fragment blocks to the device memories as inner operand,
    calculating, by the GPUs, partial supports corresponding to the relative memory addresses using the copied fragment block and the relative memory addresses,
    updating the supports of the candidate k-itemsets by synchronizing the partial supports,
    copying at least one second fragment block to the device memories as inner operand,
    calculating, by the GPUs, second partial supports corresponding to the relative memory addresses using the copied second fragment block and the relative memory addresses and
    updating the supports of the candidate k-itemsets by synchronizing the second partial supports; and
  mining frequent k-itemsets based on the supports;
  wherein the generating transaction blocks comprises:
  generating the fragment blocks by vertically partitioning the transaction bitmap based on the size of the device memories of the GPU;
  wherein said 1-itemset is defined as a set containing a single item;
  wherein said k-itemset is defined as a set containing a plurality of items in a count of k; and
  wherein said support is defined as a number of occurrences.

10. A frequent pattern mining method, comprising:
  mining frequent 1-itemsets from transaction data;
  selecting a traversal from the first level (TFL) strategy or a hopping from intermediate level (HIL) strategy;
  generating blocks from bit vectors corresponding to the frequent 1-itemsets based on the selected strategy, by vertically partitioning a transaction bitmap including the bit vectors, the transaction bitmap being represented by a vertical bitmap layout, when the TFL strategy is selected, wherein each bit vector describes an occurrence of a different 1-itemset of a plurality of 1-itemsets in a plurality of data transactions of said transaction data being mined for frequent patterns, wherein each bit of a certain bit vector indicates an occurrence of a respective 1-itemset in a specific one of said plurality of data transactions and wherein each of said generated blocks comprises a different portion, of a pre-defined size, of each of the bit vectors;

calculating supports of candidate k-itemsets from the blocks using graphic processing units (GPUs), by:
generating relative memory addresses of the candidate k-itemsets using a dictionary that maps a frequent 1-itemset of the transaction bitmap to a relative memory address,
copying the relative memory addresses to device memories of the GPUs as outer operand,
copying one of the blocks to the device memories as inner operand,
calculating, by the GPUs, partial supports corresponding to the relative memory addresses using the copied block and the relative memory addresses,
updating the supports of the candidate k-itemsets by synchronizing the partial supports,
copying a second block to the device memories as inner operand,
calculating, by the GPUs, second partial supports corresponding to the relative memory addresses using the copied second block and the relative memory addresses, and
updating the supports of the candidate k-itemsets by synchronizing the second partial supports; and
mining frequent k-itemsets based on the supports;
wherein the generating blocks from bit vectors comprises:
generating the blocks from bit vectors based on the size of the device memories of the GPU;
wherein said 1-itemset is defined as a set containing a single item;
wherein said k-itemset is defined as a set containing a plurality of items in a count of k; and
wherein said support is defined as a number of occurrences.

11. The frequent pattern mining method of claim 10, wherein the generating comprises:
generating fragments by dividing the frequent 1-itemsets, when the HIL strategy is selected;
generating itemsets being all combinations of frequent 1-itemsets in each of the fragments;
calculating bit vectors corresponding to the generated itemsets; and
generating fragment blocks by vertically partitioning a transaction bitmap including the calculated bit vectors and dividing the transaction bitmap for each of the fragments, the transaction bitmap being represented by a vertical bitmap layout.

12. The frequent pattern mining method of claim 11, wherein the calculating of the supports comprises:
generating relative memory addresses of the candidate k-itemsets using a dictionary that maps an itemset of the transaction bitmap to a relative memory address;
copying the relative memory addresses to device memories of the GPUs as outer operand;
copying at least one of the fragment blocks to the device memories as inner operand;
calculating, by the GPUs, partial supports corresponding to the relative memory addresses using the copied fragment block and the relative memory addresses; and
updating the supports of the candidate k-itemsets by synchronizing the partial supports.

13. A frequent pattern mining apparatus, comprising:
a central processing unit (CPU); and
a main memory,
wherein the CPU is configured to:
generate blocks from bit vectors corresponding to frequent 1-itemsets, by vertically partitioning a transaction bitmap including the bit vectors, the transaction bitmap being represented by a vertical bitmap layout, wherein each bit vector describes an occurrence of a different 1-itemset of a plurality of 1-itemsets in a plurality of data transactions being mined for frequent patterns, wherein each bit of a certain bit vector indicates an occurrence of a respective 1-itemset in a specific one of said plurality of data transactions and wherein each of said generated blocks comprises a different portion, of a pre-defined size, of each of the bit vectors,
copy relative memory addresses of candidate k-itemsets, from the main memory to device memories of graphic processing units (GPUs), by:
generating the relative memory addresses of the candidate k-itemsets using a dictionary that maps a frequent 1-itemset of the transaction bitmap to a relative memory address; and
copying the generated relative memory addresses to the device memories as outer operand,
copy at least one same block required for calculating supports of the candidate k-itemsets among the blocks, from the main memory to the device memories, by copying one of the blocks to the device memories as inner operand, and
update the supports of the candidate k-itemsets by calculating, by the GPUs, partial supports corresponding to the relative memory addresses using the copied block and the relative memory addresses; and synchronizing the partial supports corresponding to the relative memory addresses calculated by the GPUs;
wherein the CPU is configured to:
generate the blocks from bit vectors based on the size of the device memories of the GPU;
wherein said 1-itemset is defined as a set containing a single item;
wherein said k-itemset is defined as a set containing a plurality of items in a count of k; and
wherein said support is defined as a number of occurrences.

* * * * *